US007786508B2

(12) United States Patent
Perera et al.

(10) Patent No.: US 7,786,508 B2
(45) Date of Patent: Aug. 31, 2010

(54) HIGH OPERATING TEMPERATURE SPLIT-OFF BAND INFRARED DETECTORS

(75) Inventors: A.G. Unil Perera, Mableton, GA (US); Steven G. Matsik, Chamblee, GA (US)

(73) Assignee: Georgia State University Research Foundation, Inc., Atlanta, GA (US)

( * ) Notice: Subject to any disclaimer, the term of this patent is extended or adjusted under 35 U.S.C. 154(b) by 467 days.

(21) Appl. No.: 11/849,464

(22) Filed: Sep. 4, 2007

(65) Prior Publication Data

US 2008/0054251 A1     Mar. 6, 2008

Related U.S. Application Data

(60) Provisional application No. 60/841,756, filed on Sep. 1, 2006.

(51) Int. Cl.
    *H01L 31/0304*    (2006.01)
    *H01L 21/00*    (2006.01)
(52) U.S. Cl. .......................... 257/184; 438/94
(58) Field of Classification Search ................. 257/184; 438/94
See application file for complete search history.

(56) References Cited

OTHER PUBLICATIONS

P.V.V. Jayaweera et al., "Spin Split-off transition based IR detectors operating at high temperatures", Infrared Physics and Technology 50 (2007), pp. 279-283.*
A. G. U. Perera, H. X. Yuan, and M. H. Francombe, "Homojunction Internal Photoemission Far-Infrared Detectors: Photoresponse Performance Analysis," Journal of Applied Physics 77, 915-924 (Jan. 15, 1995).
A. G. U. Perera, W. Z. Shen, H. C. Liu, M. Buchanan, M. O. Tanner, and K. L. Wang, "Demonstration of Si Homojunction Far-Infrared Detectors," Appl. Phys. Lett. 72, 2307 (May 4, 1998).
A. G. U. Perera, S. G. Matsik, B. Yaldiz, H. C. Liu, A. Shen, M. Gao, Z. R. Wasilewski, and M. Buchanan, "Heterojunction Wavelength-Tailorable Far-Infrared Photodetectors with Response Out to 70 µm," Appl. Phys. Lett. 78, 2241-2243 (Apr. 9, 2001).
S. G. Matsik, M. B. M. Rinzan, D. G. Esaev, A. G. U. Perera, H. C. Liu, and M. Buchanan, "20 µm Cutoff HeteroJunction Internfacial Work Function Internal Photoemission Detectors," Appl. Phys. Lett. 84, 3435-3437 (May 3, 2004).
D. M. Schaadt, B. Feng, and E. T. Yu, "Enhanced Semiconductor Optical Absorption Via Surface Plasmon Excitation in Metal Nanoparticles," Applied Physics Letters 86, 063106-3 (Feb. 2, 2005).
M. Jhabvala, K. Choi, A. C. Goldberg, A. T. La, and S. D. Gunapala, "Development of a 1K×1K GaAs QWIP Far IR Imaging Array," San Diego, CA, USA, 2004 (SPIE), pp. 175-185.

(Continued)

*Primary Examiner*—Evan Pert
(74) *Attorney, Agent, or Firm*—Thomas, Kayden, Horstemeyer and Risley, LLP

(57) ABSTRACT

Systems and methods for at or near room temperature of infrared detection are disclosed. Embodiments of the disclosure include high temperature split-off band infrared detectors. One embodiment, among others, comprises a first barrier and a second barrier with an emitter disposed between the first and second barrier, each barrier being a layer of a first semiconductor material and the emitter being a layer of a second semiconductor material.

25 Claims, 17 Drawing Sheets

OTHER PUBLICATIONS

M. B. M. Rinzan, A. G. U. Perera, S. G. Matsik, H. C. Liu, Z. R. Wasilewski, and M. Buchanan, "AlGaAs Emitter/GaAs Barrier Terahertz Detector with a 2.3 THz Threshold," Appl. Phys. Lett. 86, 071112 (Feb. 9, 2005).

K. S. Zhuravlev, V. A. Kolosanov, A. G. Milekhin, V. G. Polovinkin, T. S. Shamirzaev, Yu N. Rakov, Yu B. Myakishev, J. Fryar, E. McGlynn, and M. O. Henry, "Infrared Light Emission from GaAs MESFETs Operating at Avalanche Breakdown Conditions," Semicond. Sci. Technol. 19, S94-S95 (Mar. 1, 2004).

J. R. Hoff, M. Razeghi, and G. J. Brown, Effect of the Spin Split-Off Band on Optical Absorption in p-type $Ga_{1-x}In_xAs_yP_{1-y}$ Quantum-Well Infrared Detectors Phys. Rev. B 54, 10773-10783 (Oct. 15, 1996).

D. G. Esaev, M. B. M. Rinzan, S. G. Matsik, and A. G. U. Perera, "Design and Optimization of GaAs/AlGaAs Heterojunction Infrared Detectors," J. Appl. Phys. 96, 4588-4597 (2004).

J. Maserjian, "Long-Wave Infrared (L-WIR) Detectors Based on III-V Materials," SPIE 1540, 127 (Jul. 1991).

R. P. G. Karunasiri, J. S. Park, and K. L. Wang, "Normal incidence Infrared Detector using Intervalence-Subband Transitions in $Si_{1-x}Ge_x$/Si Quantum Wells," Appl. Phy. Lett. 62, 2434 (Nov. 16, 1992).

H. Jiang and J. Singh, "Strain Distribution and Electronic Spectra of InAs/GaAs Self-Assembled Dots: An Eight-Band Study," Phys Rev B 56, 4696-4701 (Aug. 15, 1997).

A. Rogalski, "Optical Detectors for Focal Plane Arrays," Opto-Electronics Review 12, 221-245 (2004).

A. G. U. Perera, W. Z. Shen, S. G. Matsik, H. C. Liu, M. Buchanan, and W. J. Schaff, "GaAs/AlGaAs Quantum Well Photodetectors with a Cutoff Wavelength at 28 µm, " Appl. Phys. Lett. 72, 1596-1598 (1998).

A. G. U. Perera, H. X. Yuan, S. K. Gamage, W. Z. Shen, M. H. Francombe, H. C. Liu, M. Buchanan, and W. J. Schaff, "GaAs Multilayer p+-i Homojunction Far-Infrared Detectors," Journal of Applied Physics 81, 3316 (Apr 1, 1997).

P. Bhattacharya, X. H. Su, S. Chakrabarti, G. Ariyawansa, and A. G. U. Perera, Characteristics of a Tunneling Quantum-Dot Infrared Photodetector Operating at Room Temperature, Appl. Phys. Lett. 86, 191106 (May 3, 2005).

M.Z. Tidrow, W. W. Clark III, W. Tipton, R. Hoffman, W. A. Beck, et al., "Uncooled Infrared Detectors and Focal Plane Arrays", Beijing, China, Sep. 18, 1998 (SPIE) pp. 178-187.

\* cited by examiner

HIGH OPERATING TEMPERATURE SPLIT-OFF BAND INFRARED DETECTORS

CROSS-REFERENCE TO RELATED APPLICATION

This application claims priority to U.S. provisional application entitled "High Operating Temperature Split-Off Band Infrared Detectors," having Ser. No. 60/841,756 filed on Sep. 1, 2006, which is entirely incorporated herein by reference.

STATEMENT REGARDING FEDERALLY SPONSORED RESEARCH OR DEVELOPMENT

This invention(s) was made with government support under Grant No.: NSF ECS 0140434 awarded by the National Science Foundation and NSF ECS 0553051 awarded by the National Science Foundation. The government has certain rights in the invention(s).

BACKGROUND

The at or near room temperature detection of infrared radiation is becoming important in a wide range of applications in the civilian, industrial, medical, astronomical and military sectors. Infrared radiation can be detected by photon detectors and thermal detectors. However, excessive dark current levels can impede reliable detection of radiation by infrared detectors. Dark current is the background noise generated by thermal activity in a photodetector. In the semiconductor materials used in photodetectors, the dark current typically increases with temperature. Hence, the dark current effectively determines an operating temperature limit for a detector of well below room temperature. It is common for cooling temperatures to be at or below 77 degrees Kelvin (77 K). This can require a substantial cooling system to reduce detector temperatures to the necessary level. Therefore, a need exists for near room temperature detection of infrared radiation without substantial cooling requirements.

SUMMARY

Embodiments of the present disclosure include high temperature split-off band infrared detectors. Briefly described, one embodiment, among others, comprises a first barrier and a second barrier, each barrier being a layer of a first semiconductor material. The embodiment further includes an emitter disposed between the first and second barriers so as to form a heterojunction at each interface between the emitter and the first and second barriers, the emitter being a layer of a second semiconductor material different from the first semiconductor material and having a split-off response to optical signals and further having a cutoff wavelength.

BRIEF DESCRIPTION OF THE DRAWINGS

Many aspects of this disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
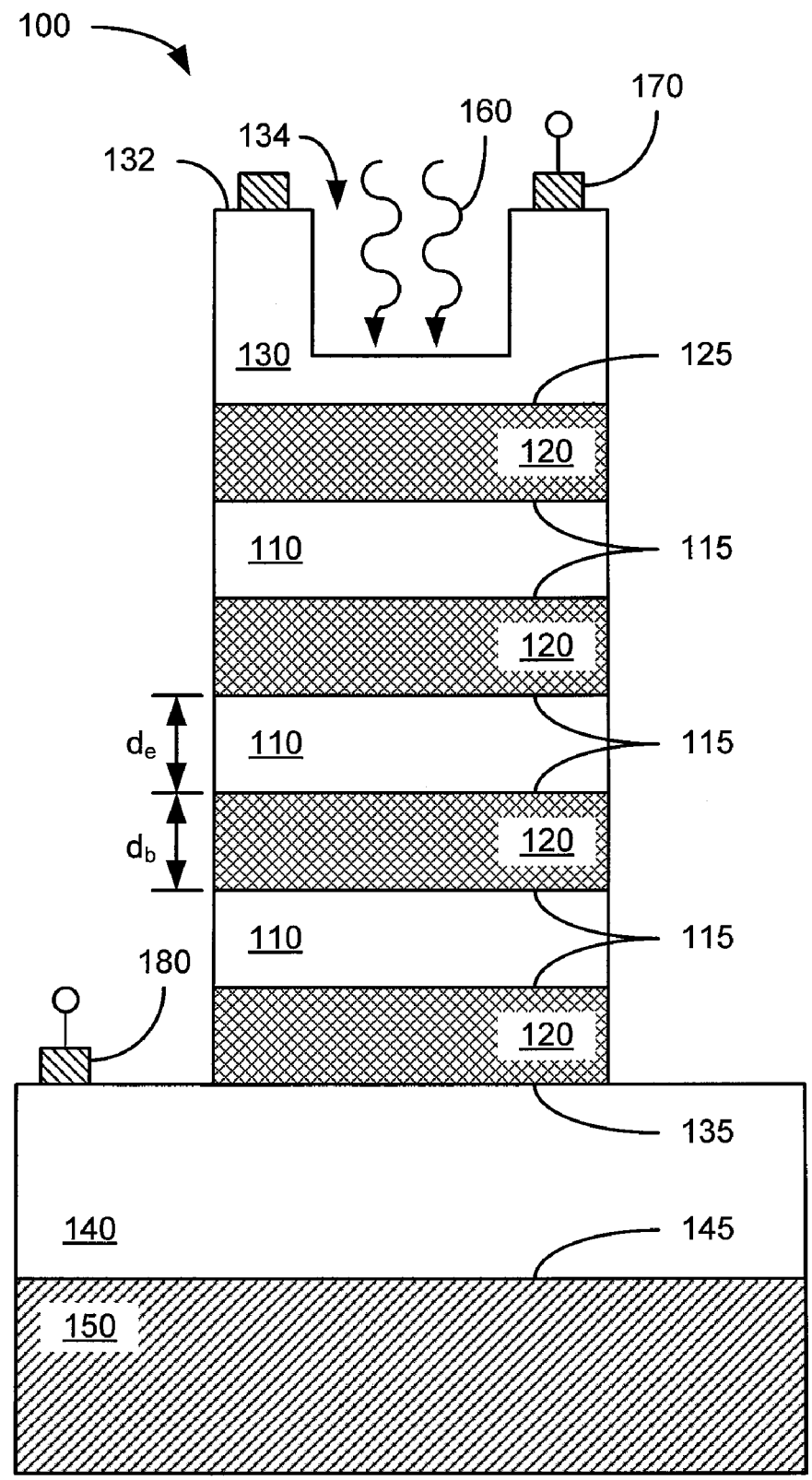
FIG. 1 illustrates an embodiment of a Split-off Infrared Photodetector (SPIP) detector.

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, organic chemistry, liquid phase chemistry, gas phase chemistry, biology, physics, quantum physics and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in atmosphere. Standard temperature and pressure are defined as 25° C. and 1 atmosphere.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Photon detectors such as Homojunction Interfacial Workfunction Internal Photoemission (HIWIP) detectors, Heterojunction Interfacial Workfunction Internal Photoemission (HEIWIP) detectors, and Quantum Well Infrared Photodetectors (QWIP) can detect radiation in the middle infrared (MIR) and far infrared (FIR) ranges. In general, the wavelength ($\lambda$) range for the MIR is about 5 to 30 μm and for the FIR is greater than about 30 μm. HIWIP and HEIWIP detectors can include successive doped emitter layers and undoped barrier layers. In the MIR and FIR ranges, detection takes place by free carrier absorption in the emitter layers followed by the internal photoemission across the barrier and collection. The cutoff wavelength is determined by the workfunction at the interface. The workfunction can be affected by the bandgap narrowing caused by the doping in the emitter. By adjusting the device parameters (e.g., the doping concentration in the emitter region and material composition of the emitters and barriers) the cutoff wavelength may be tailored to the desired range.

FIG. 1 illustrates an embodiment of a SPIP detector 100. In a SPIP detector, a heterojunction is formed by two different electrical types of two chemically different materials with each material having a bandgap different from that of the other. An example of a heterojunction is a GaAs/$Al_{(x)}Ga_{(1-x)}$ As junction, where x is a number satisfying 0<x<1. The design is analogous to a HEIWIP detector that has been optimized for split-off band response. However, the detection mechanism differs from that used in the HEIWIP detectors. A description of HEIWIP detectors is provided in U.S. Pat. No. 7,253,432, issued on Aug. 7, 2007, entitled "Heterojunction Far Infrared Photodetector," which is incorporated herein by reference.

In general, the HEIWIP detector can have several emitter layers 110 and barrier layers 120 sandwiched between first and second contact layers, 130 and 140 respectively. The total number of barrier layers 120 is N, where N is an integer greater than 1. In the exemplary embodiment illustrated in FIG. 1, the total number of barriers 120 is N=4. Note that, in another embodiment (not shown), a single emitter positioned between two barriers is workable.

Each barrier 120 is a layer of a material made from a first group III element (e.g., Al, Ga, In, and combinations thereof), a second group III element (e.g., Al, Ga, In, and combinations thereof), and a first group V element (e.g., N, P, As, Sb, and combinations thereof). The barrier 120 is further characterized by a bandgap. The construction parameters of each barrier 120 can include, but are not limited to, the chemical identities of the first and second group III elements and the first group V element, the thickness of the barrier layer 120, the relative concentration of the first and second group III elements, the bandgap of the barriers 120, and the total number N of the barriers 120.

In one embodiment, among others, the first group III element is Al, the second group III element is Ga, and the first group V element is As. The concentration of the first group III element, Al, is characterized by a normalized amount x, x being in the range of 0 to about 1, about 0.05 to 0.50, and about 0.16 to 0.30, and the concentration of the second group III element, Ga, is characterized by a normalized relative amount 1−x. The thickness of each barrier layer 120, identified as $d_b$ in FIG. 1, can range from about 400 to 4000 Å, about 500 to 1000 Å, and about 600 to 800 Å.

The photodetector 100 further has emitter layers 110, the total number of emitters is N−1. In the exemplary embodiment illustrated in FIG. 1, the total number of emitters 110 is N−1=3. Each emitter 110 is a layer of material made from a third group III element (e.g., Al, Ga, In, and combinations thereof) and a second group V element (e.g., N, P, As, Sb, and combinations thereof). The emitter 110 is further characterized by a bandgap different from that of the barriers 120, wherein each emitter 110 is located between two barriers 120 so as to form a heterojunction at each interface 115 between an emitter 110 and a barrier 120. Moreover, each emitter 110 may be doped to cause free carriers in the emitter 110 by adding a doping element including, but not limited to, group II elements (e.g., Be, Mg, and combinations thereof) and/or group IV elements (e.g., C, Si, Ge, Sn, and combinations thereof). The construction parameters of each emitter 110 can include the chemical identities of the third group III element, the second group V element, and the doping element from the group II, IV or VI elements, the thickness of the emitter layer 110, the doping concentration of the doping element, the bandgap of the emitters 110, and the total number N−1 of the emitters 110.

In one embodiment, among others, the third group III element is Ga, the doping element is the group II element Be, and the second group V element is As. The thickness of each emitter layer 110, identified as $d_e$ in FIG. 1, can be about 150 to 700 Å, about 150 to 400 Å, and about 150 to 200 Å. The doping concentration of the doping element can be about $1\times10^{17}$ to $5\times10^{19}$ cm$^{-3}$, about $3\times10^{17}$ to $1\times10^{19}$ cm$^{-3}$, and about $1\times10^{18}$ to $1\times10^{19}$ cm$^{-3}$. The split-off bandgap of each emitter 110 is characterized by a workfunction ($\Delta_{SO}$) substantially from about 3 to 800 meV, about 19 to 390 meV, and about 280 to 390 meV. The interface 115 of each emitter 110 with each barrier 120 is characterized by a workfunction ($\Delta$) substantially about 15 to 400 meV, about 60 to 400 meV, and about 200 to 400 meV. By having these two workfunctions similar to each other the optimum operating temperature could be achieved. By having workfunction ($\Delta$) of an interface roughly equal to twice the workfunction ($\Delta_{SO}$) of the adjacent emitter the response of the photodetector 100 can be maximized.

In addition, the photodetector 100 has a first contact layer 130 in contact with one outermost barrier 120 at interface 125. The photodetector 100 also has a second contact layer 140 in contact with the opposite outermost barrier 120 at interface 135. The first contact layer 130 and the second contact layer 140 are made from materials substantially identical to the material from which emitters 110 are made. Depending on the doping required for ohmic contacts, the first contact 130 may also serve as a top emitter layer. The photodetector 100 further has a substrate 150 in contact with the second contact layer 140 at interface 145. The substrate 150 is made from a material compatible with the material from which the emitters 110 and barriers 120 are made but may be either undoped or doped.

The first contact layer 130 has a first surface 132, opposite interface 125, and an opening 134 defined in the first surface 132 to receive optical signals 160. The opening 134 may be formed by partially etching the first surface 132 of the first contact layer 130. Moreover, conductive contacts 170 and 180 located at the first and second contact layers 130 and 140, respectively, can be utilized for measuring the response of the photodetector 100 to the incoming optical signals 160.

Figure 2:
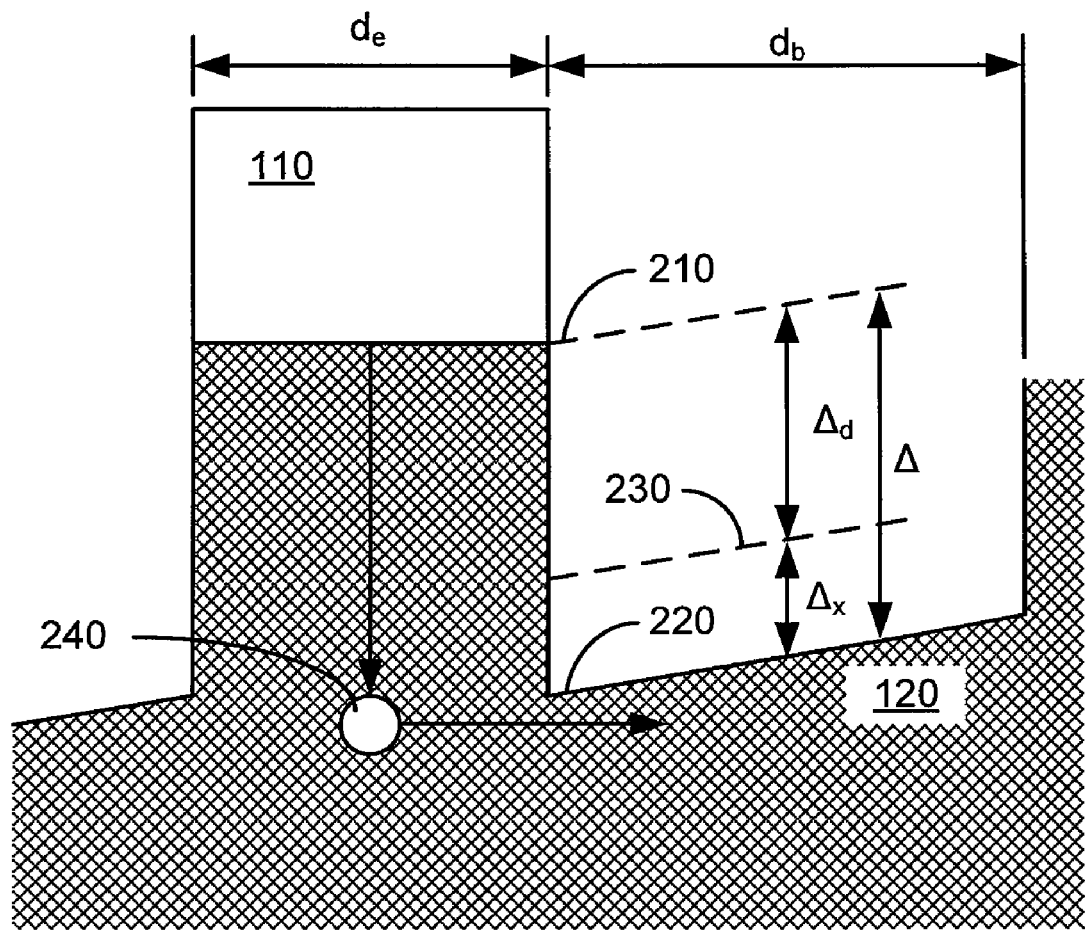
FIG. 2 is an illustration of an exemplary p-type band diagram for a single period of a SPIP detector.

FIG. 2 is an illustration of an exemplary p-type band diagram for a single period of a SPIP detector. The workfunction, indicated as $\Delta$ in FIG. 2, of each emitter 110 is defined as the difference between the three dimensional Fermi level 210 of the emitter 110 and the conduction band 220 of a corresponding barrier 120. The workfunction is given by $\Delta = \Delta_d + \Delta_x$, where $\Delta_d$ and $\Delta_x$ are the contributions from doping of the emitter 110 and the difference fraction of the first group III element of the emitter 110 and the barrier 120, respectively. In an exemplary embodiment utilizing a barrier of $Al_xGa_{1-x}As$ and a p-doped emitter of GaAs, $\Delta_d$ represents the contribution of the emitter 110 doping and $\Delta_x$ represents the contribution of the Al fraction (x) in the barrier 120. As the Al fraction (x) of the barrier 120 is reduced, $\Delta$ will be limited by $\Delta_d$. In the case where the Al is eliminated (i.e., x=0), the interface 115 (see FIG. 1) between the emitter 110 and barrier 120 is a homojunction. The dashed line 230 indicates the valence-band edge if the barrier 120 material were only GaAs (i.e., a homojunction detector). By adjusting and the fraction of the first group III element of the barrier 120 and/or the doping density of the emitter 110, the workfunction ($\Delta$) can be tailored to provide a desired bandgap. The resulting structure has sharp interfaces between the layers of material reducing dark current and detector noise The emitters 110 are doped to a sufficiently high level so that the carriers 240 form a 3-dimensional distribution in the emitters 110 and detection is by free carrier absorption. By adjusting the fraction of the first group III element of the barrier 120 and/or the doping density of the emitter 110, the detection range can be tailored to any desired wavelength. The cutoff wavelength can be adjusted at integer or non-integer multiples of the wavelength detection range of a detector (e.g., the cutoff wavelength can be four, three, two or 1.3 times the upper limit of the wavelength detection range). In one embodiment, among others, the barriers 120 can have a low Al fraction (x) so that the workfunction ($\Delta$ in FIG. 2) will be small to allow operation at FIR wavelengths. Increasing the doping in the emitter layers 110 can increase the absorption in the emitters 110, but it will also increase the dark current of the detector 100. Doping of the emitter layers 110 balances the dark current effect and the absorption quantum efficiency in the emitter layers 110.

HEIWIP detectors designed for the MIR and FIR ranges also exhibit near infrared (NIR) response peaks. In general, the wavelength ($\lambda$) range for the NIR is less than about 5 μm for GaAs/AlGaAs based detectors. These peaks are created by split-off (S—O) band effects and appear on top of the free carrier response region. These relatively strong S—O responses can be seen up to 130 K, while the free carrier response disappeared beyond 40 K. The S—O band IR detectors can be based on four detection mechanisms, with each depending upon three processes: (i) the photoabsorption that generates excited carriers, (ii) the escape of the carriers, and (iii) the sweep out and collection of the escaped carriers. By having a high enough doping to have a scattering length similar to the emitter thickness $d_e$, the carriers will scatter before the wave function can interfere with itself and hence will not form discreet quantum states inside the well. This makes the carrier distribution in the emitter 110 three-dimensional but still bound.

Figure 3:
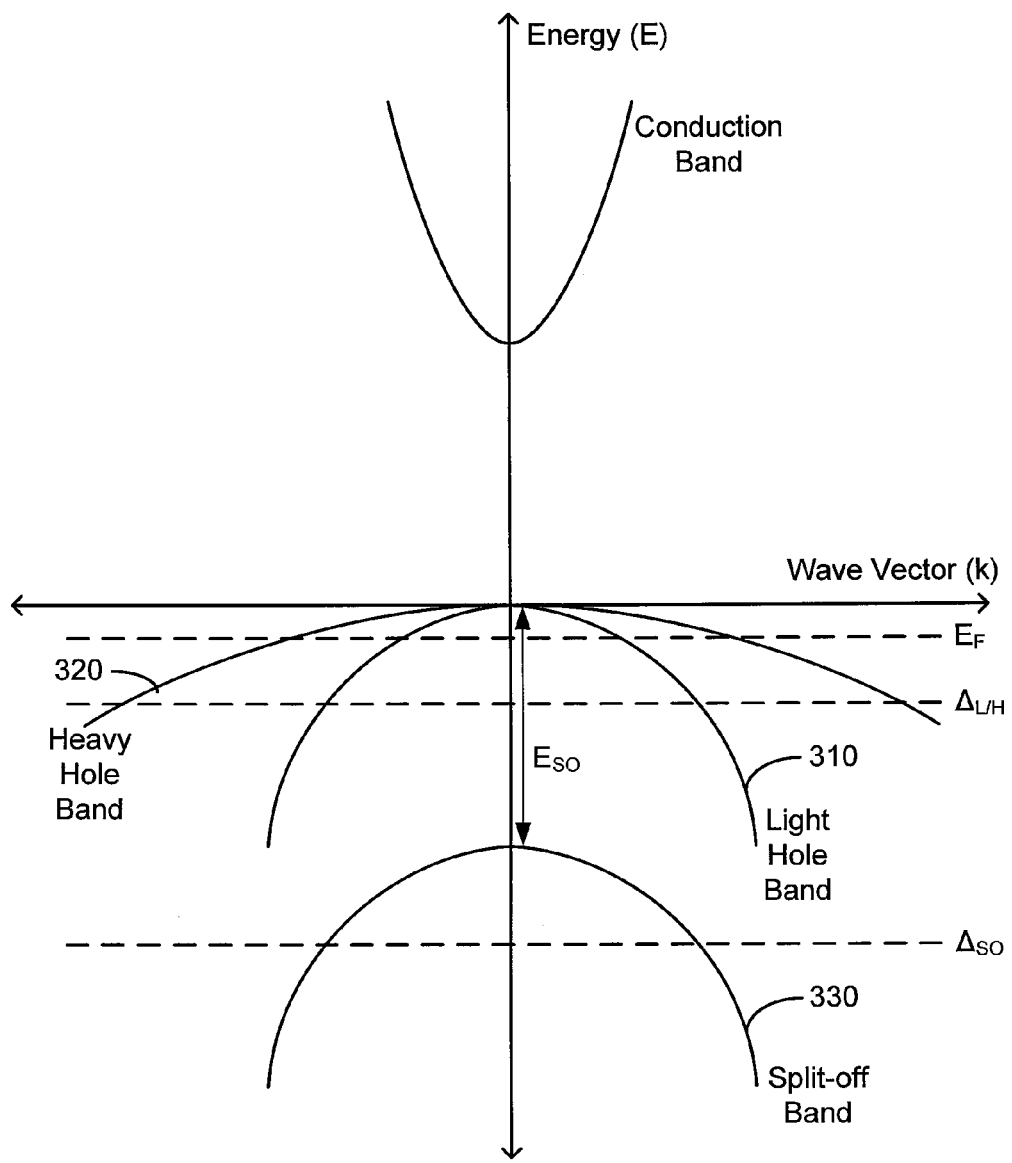
FIG. 3 is an illustration of a k-p bandstructure diagram used to describe IR detection mechanisms.

FIG. 3 is an illustration of a k-p bandstructure diagram used to describe IR detection mechanisms. In explaining the detection mechanisms, three bands will have to be considered, the light hole (L-H) band 310 and heavy hole (H-H) band 320, which are degenerate at k=0, and the split-off band 330, which is separated from them by an energy $E_{so}$. Under equilibrium conditions, a p-doped region will have a Fermi level in the L-H and H-H bands, 310 and 320, respectively, but above the maximum of the S—O band 330. The four detection mechanisms include the standard free carrier absorption used in both homojunction and heterojunction detectors described in references as shown in Examples 1-3. The absorption involves free carrier transitions, which is different from the response in Si/SiGe detectors that use transitions from bound states to either a bound split-off band state or a continuum state including a mixture of the light, heavy and split-off hole bands. The Si/SiGe detectors are QWIP detectors operating in a bound-bound or bound-continuum mode. The other three detection mechanisms involve transitions between the hole bands that can occur for p-type detectors. Once the carrier is in the S—O band, it can escape directly or scatter back into the L-H and H-H bands, 310 and 320, respectively, and then escape.

Figure 4A:
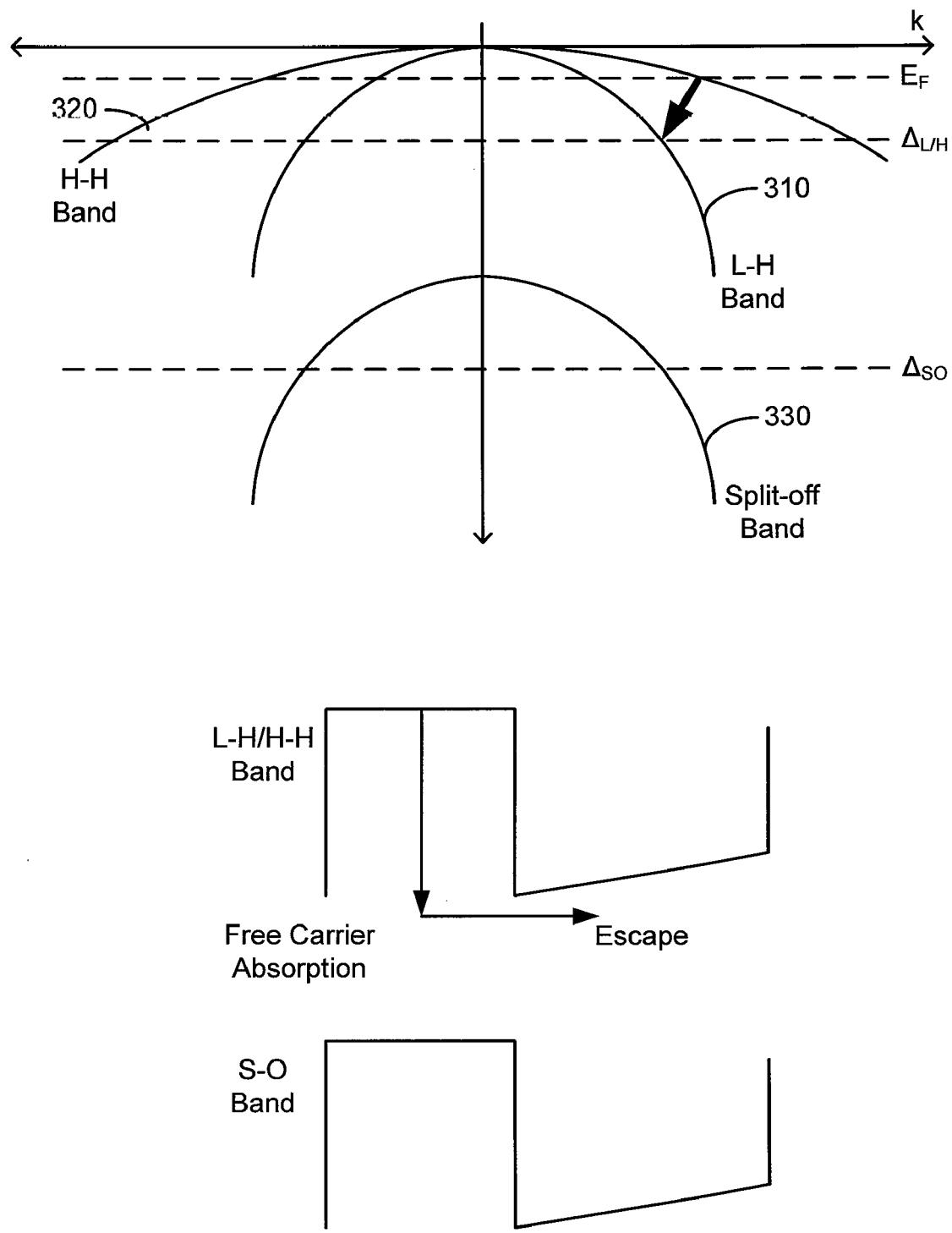
FIG. 4A is an illustration of free carrier absorption depicted on k-p bandstructure and p-type band diagrams.

FIG. 4A is an illustration of free carrier absorption depicted on k-p bandstructure and p-type band diagrams. For free carrier absorption in the emitter layers 110, the carriers remain in the L-H/H-H bands 310/320. An excited carrier then escapes from the emitter layer 110 by internal photoemission at the interface 115 between the emitters 110 and barriers 120.

Figure 4B:
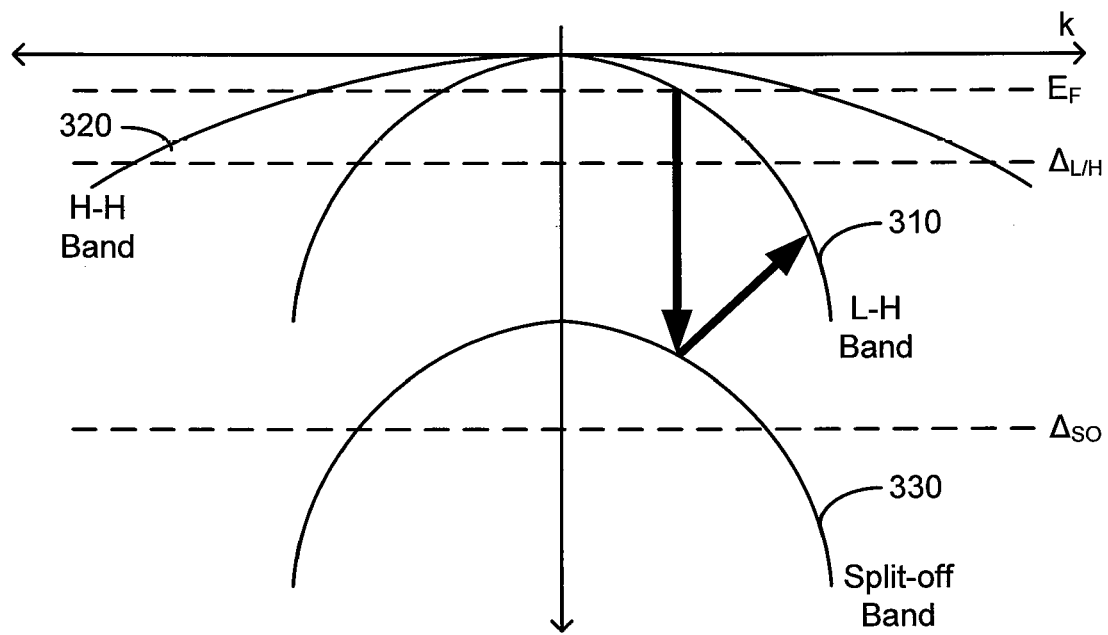
FIG. 4B is an illustration of direct photoabsorption to the split-off band followed by scattering to the L-H/H-H band depicted on k-p bandstructure and p-type band diagrams.
Figure 4B:
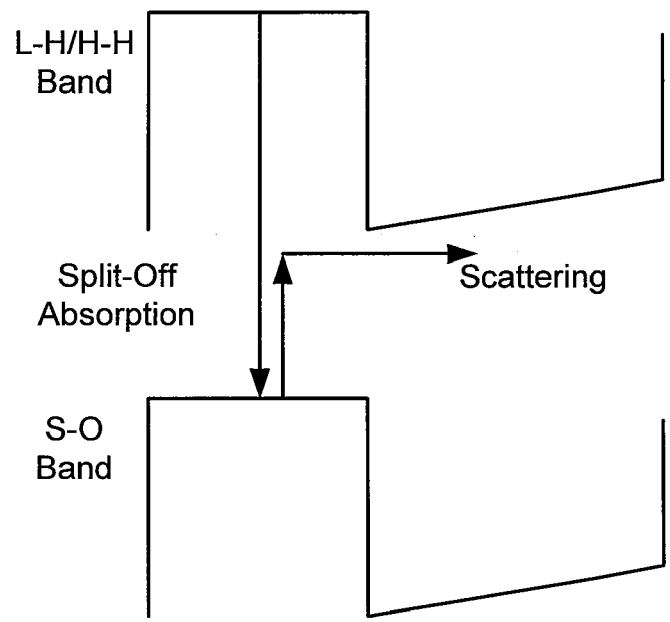

FIG. 4B is an illustration of direct photoabsorption to the split-off band followed by scattering to the L-H/H-H bands depicted on k-p bandstructure and p-type band diagrams. If the transition between the L-H/H-H bands 310/320 and the S—O band 330 is direct, the final energy of the excited carrier will not allow it to escape from the emitter 110 while remaining in the S—O band 330. This is due to the energy of states in the S—O band 330 with $k < k_f$ where $k_f$ corresponds to the Fermi level in the heavy hole band 320 being above the barrier in the S—O band 330. The carrier will scatter out of the S—O band 330 back to the L-H/H-H bands 310/320 with an excited energy, and then will be able to escape by a process via the standard mechanism. Because of the occupation in the L-H/H-H bands 310/320, this scattering time can be faster than that of a direct relaxation.

Figure 4C:
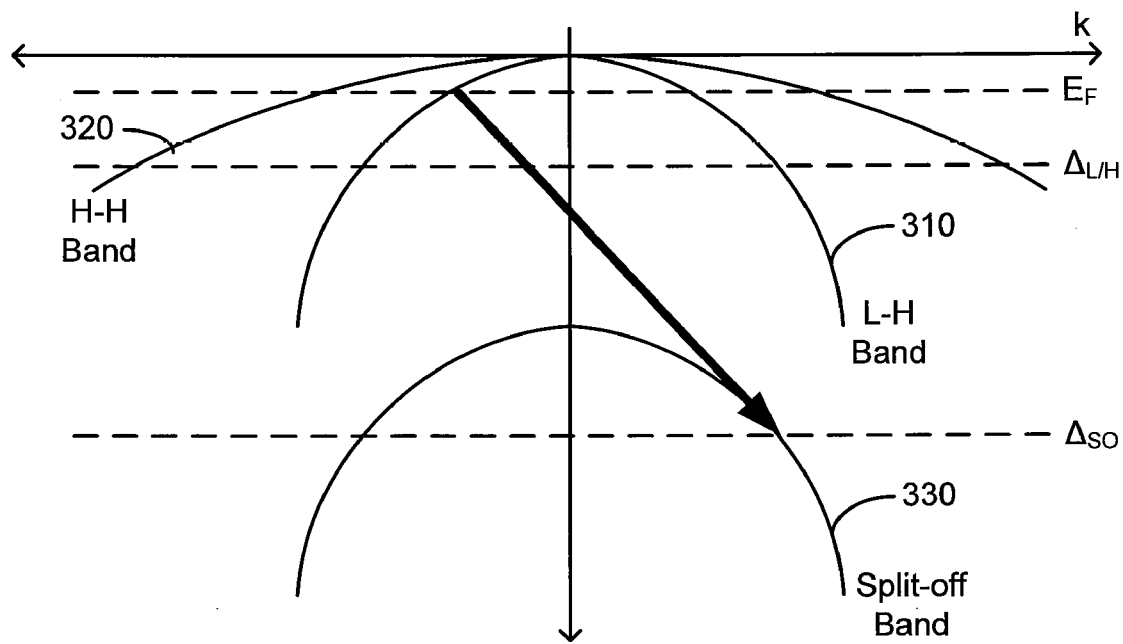
FIG. 4C is an illustration of indirect photoabsorption to the split-off band depicted on k-p bandstructure and p-type band diagrams.
Figure 4C:
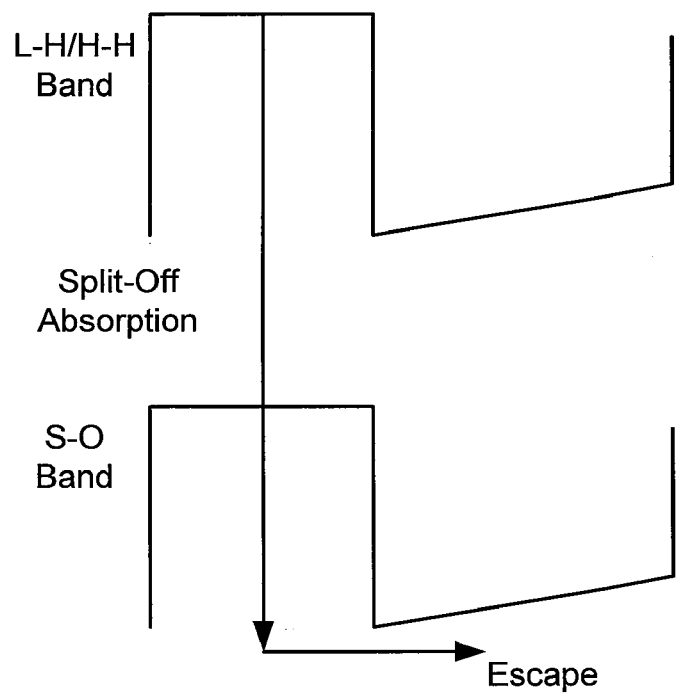

FIG. 4C is an illustration of indirect photoabsorption to the split-off band depicted on k-p bandstructure and p-type band diagrams. For an indirect transition, the excited carrier can have $k > k_f$ wherein the carrier can has sufficient energy to escape directly from the S—O band 330. In this case, the escape process will be similar to that of free carrier absorption illustrated in FIG. 4A.

Figure 4D:
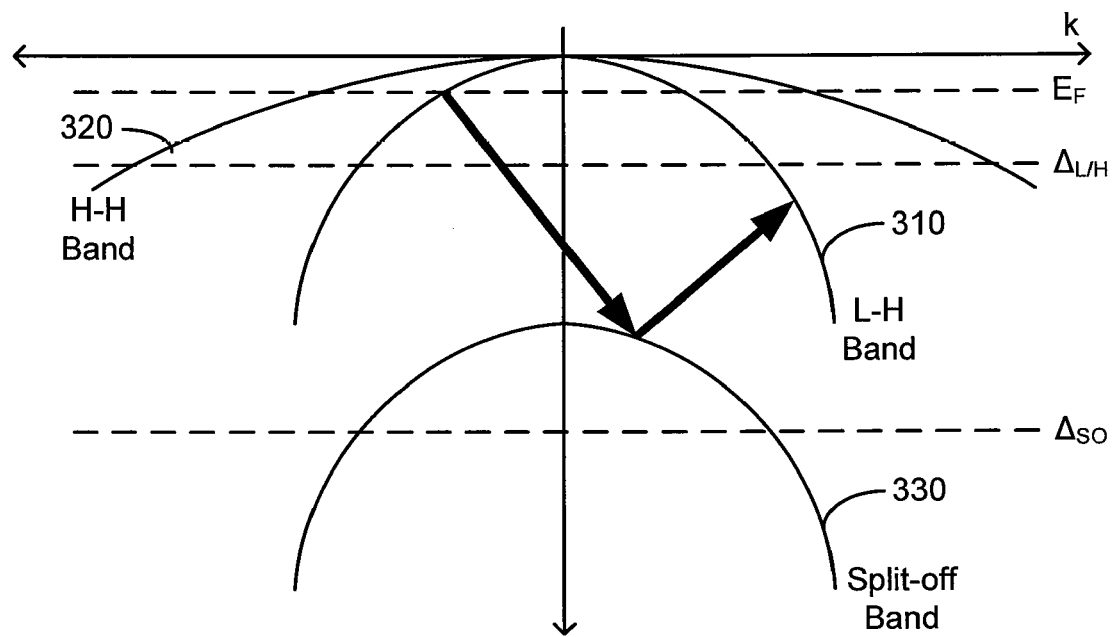
FIG. 4D is an illustration of indirect photoabsorption to the split-off band followed by scattering to the L-H/H-H bands depicted on k-p bandstructure and p-type band diagrams.
Figure 4D:
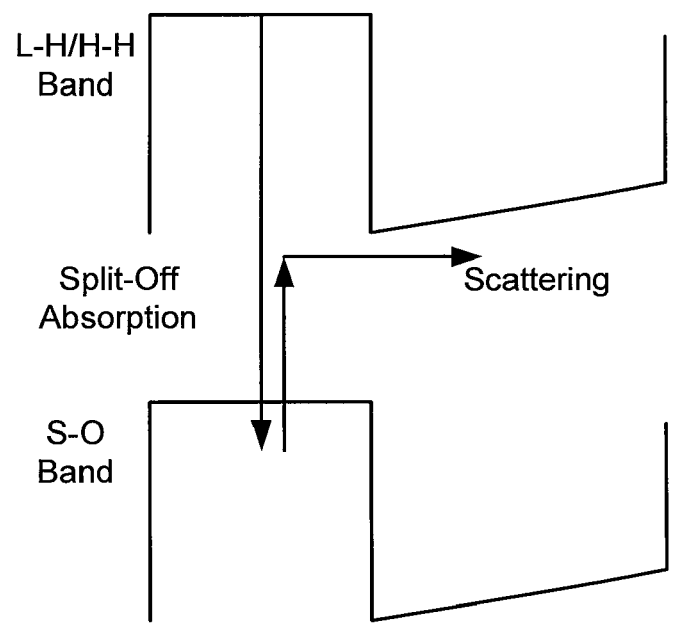

FIG. 4D is an illustration of indirect photoabsorption to the split-off band followed by scattering to the L-H/H-H bands depicted on k-p bandstructure and p-type band diagrams. For indirect transitions in which the carriers do not end up in an escape cone, it is still possible to go through the scattering process as in FIG. 4B in order to escape. Here, an indirect photoabsorption is followed by a scattering event to the L-H/H-H bands 310/320. The internal photoemission then occurs in the L-H/H-H bands 310/320. This provides an additional escape route for carriers in indirect photoabsorption that are not in the escape cone, as well as allowing carriers resulting from absorption of lower energy photons that would not have any possibility of escape in the S—O band 330. The threshold here is determined by the difference between the Fermi energy and the S—O band edge.

Two detectors were used in a study of the split-off absorption effects. The S—O response is first shown using a detector designed for the about 10-15 μm range with about a 20 μm threshold as described in reference as shown in Example 4. The detector HE0204 design includes 16 periods of p-doped 188 Å GaAs emitters doped to $10^{18}$ cm$^{-3}$ with carbon and 1250 Å $Al_{0.12}Ga_{0.88}As$ barriers. The top and bottom contacts are $1 \times 10^{19}$ cm$^{-3}$ p-doped GaAs layers with 0.2 and 0.7 μm thicknesses, respectively. For doping values used in these detectors the scattering length is about 200 Å, close to thickness of the emitter.

Figure 5:
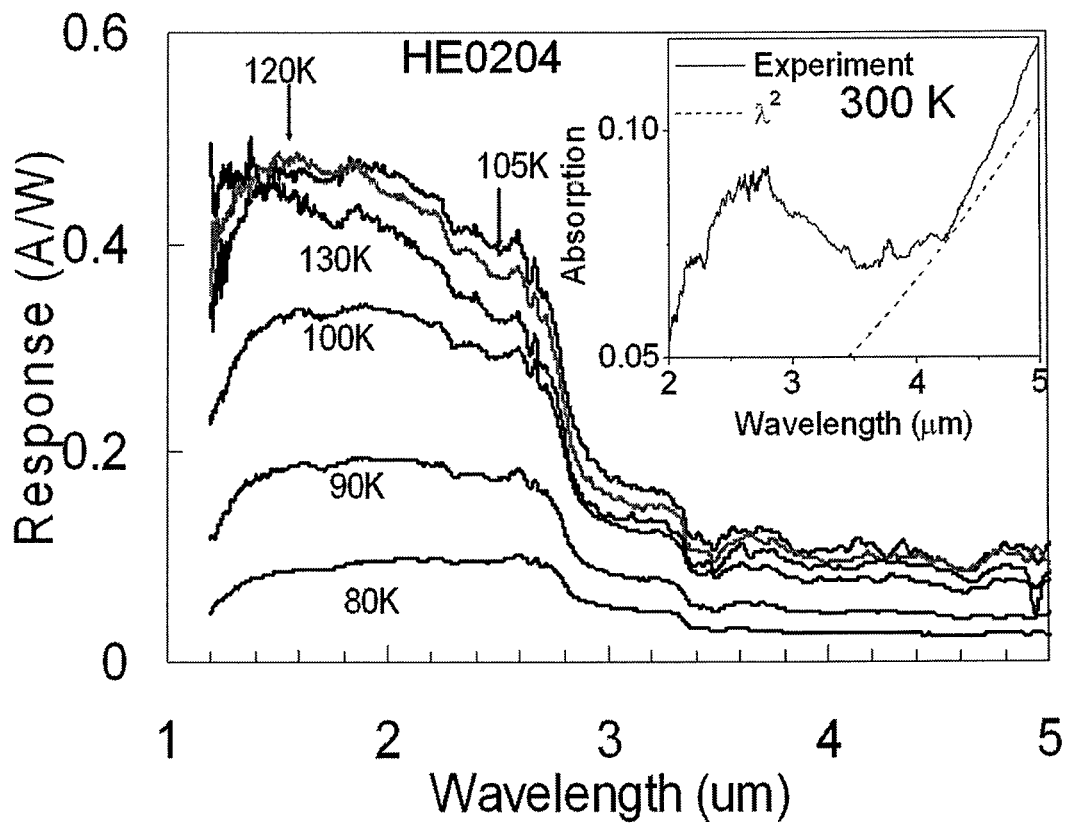
FIG. 5 is a plot that illustrates the measured responsivity and the expected and measured absorption of a first exemplary SPIP detector.

FIG. 5 is a plot that illustrates the measured responsivity and the expected and measured absorption of a first exemplary SPIP detector. The measured responsivity in the 1.2-5 μm S—O range for detector HE0204 at 79-130 K is shown in FIG. 5. A peak response of 0.45 A/W was measured at 105 K at 2.0 μm. As the temperature was increased from 105 K to 130 K, the response decreased. The increase in response with temperature may relate to phonon effects on the escape rate for excited carriers. The conversion efficiency determined by dividing the photocurrent by the incident photon rate was about 27, and at 1.8 μm a specific detectivity (D*) of $2.2 \times 10^7$ Jones was obtained at 90K. This value is low because the design of these detectors for operation at much lower temperatures. The increased barrier in an optimized detector should reduce the dark current and hence improve specific detectivity (D*). The two steps seen in the response at about 2.8 and 3.4 μm may be caused by the thresholds for the split-off absorption illustrated in FIGS. 4B, 4C, and 4D. This indicates that the use of high doping can be the preferred approach. A small signature could be identified at about 3.7 μm, which may be a signature of the bound heavy-light hole to bound S—O transitions.

Based on other experimental results and thermionic current calculations, the dark current should not increase significantly as doping is increased until defect assisted tunneling dominates. If the doping is kept below these high values, the absorption is increased, and the response and the background limited performance (BLIP) temperature should therefore increase.

Figure 6:
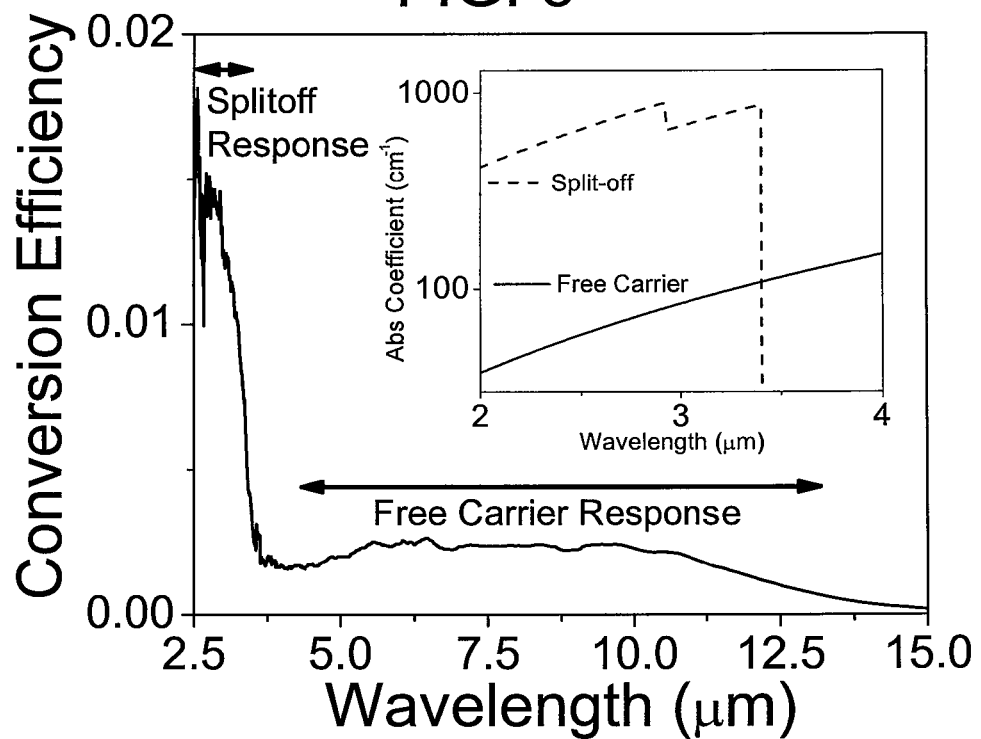
FIG. 6 is a plot that illustrates the measured conversion efficiency and calculated absorption coefficient of a second exemplary SPIP detector.
Figure 7A:
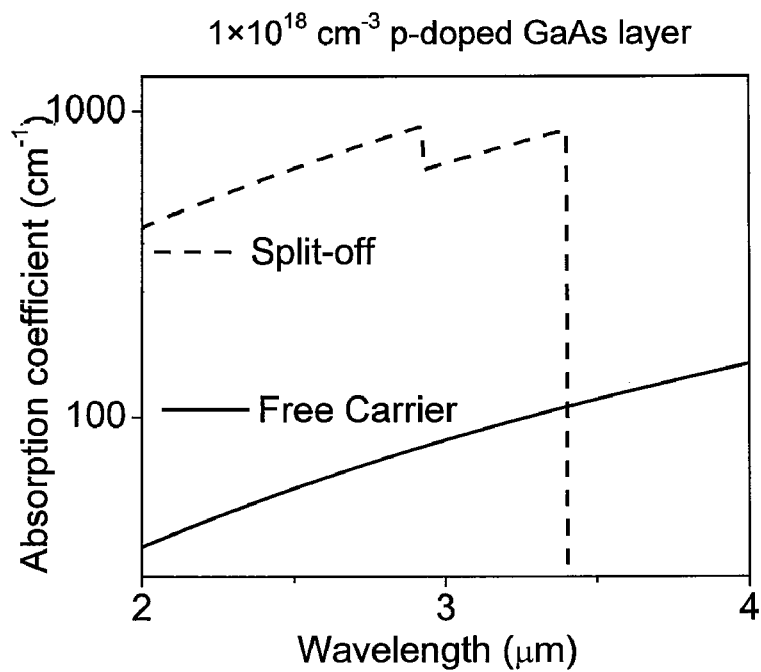
FIGS. 7A through 7E are plots illustrating the calculated absorption coefficient for the S—O band absorptions in $1\times10^{18}$ cm$^{-3}$ p-doped GaAs, InP, AlP, AlN, and GaN layers, respectively.
Figure 7B:
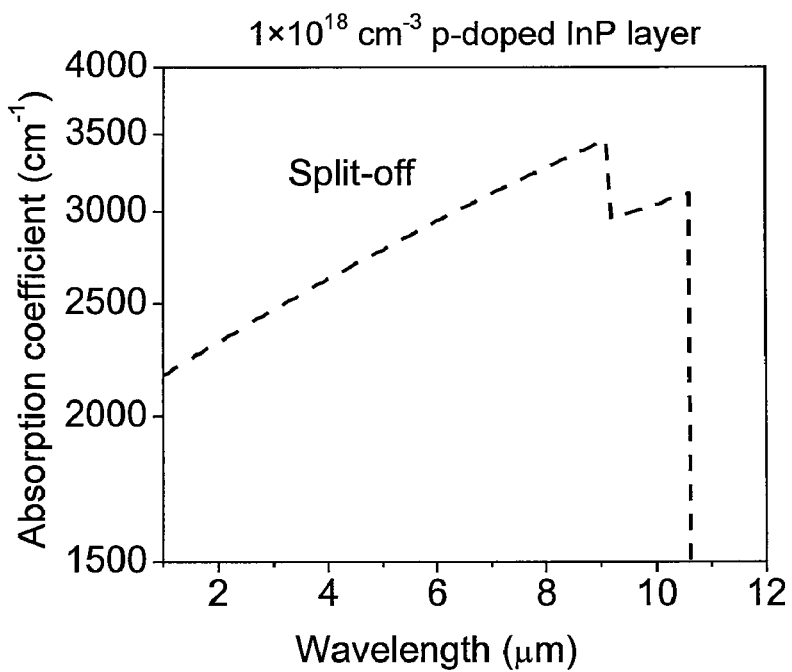
Figure 7C:
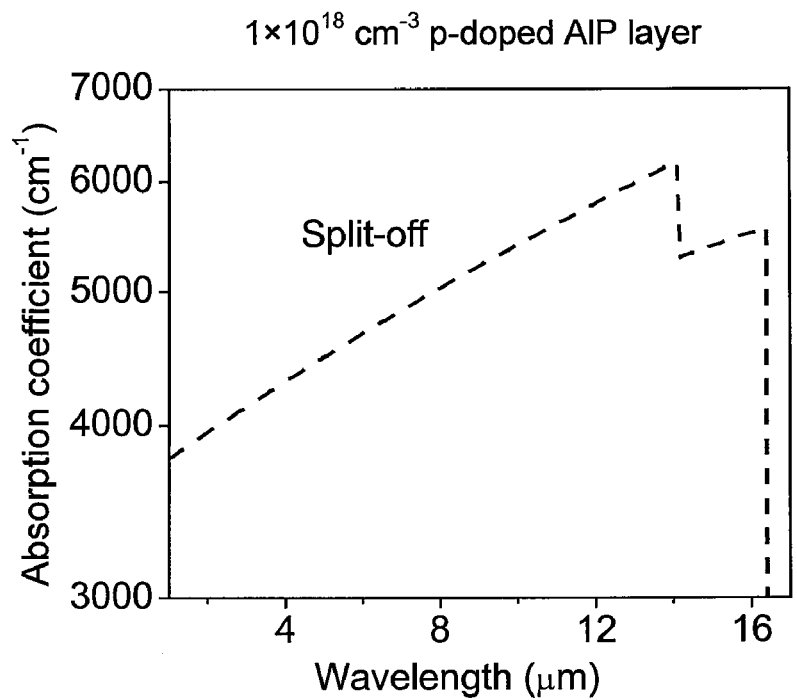
Figure 7D:
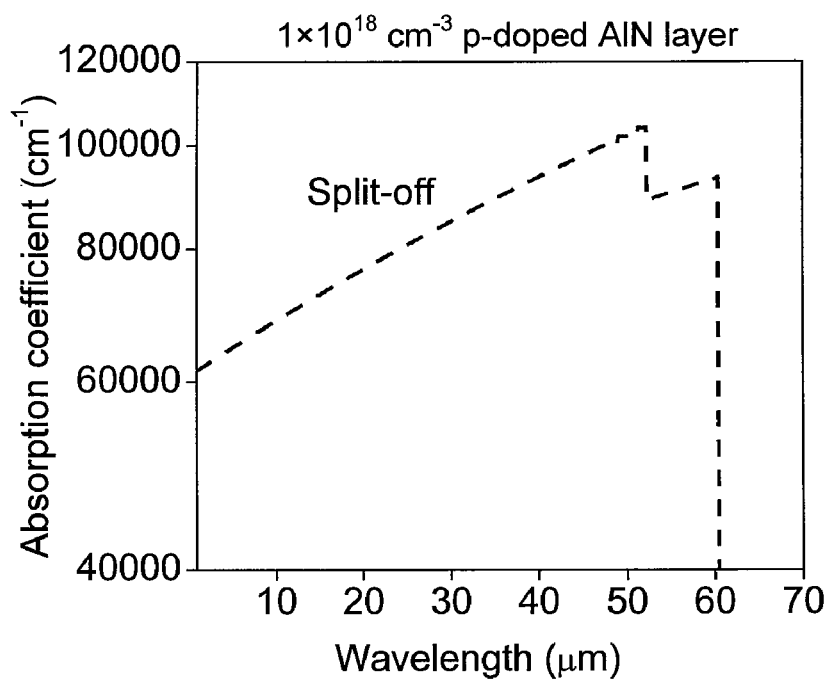
Figure 7E:
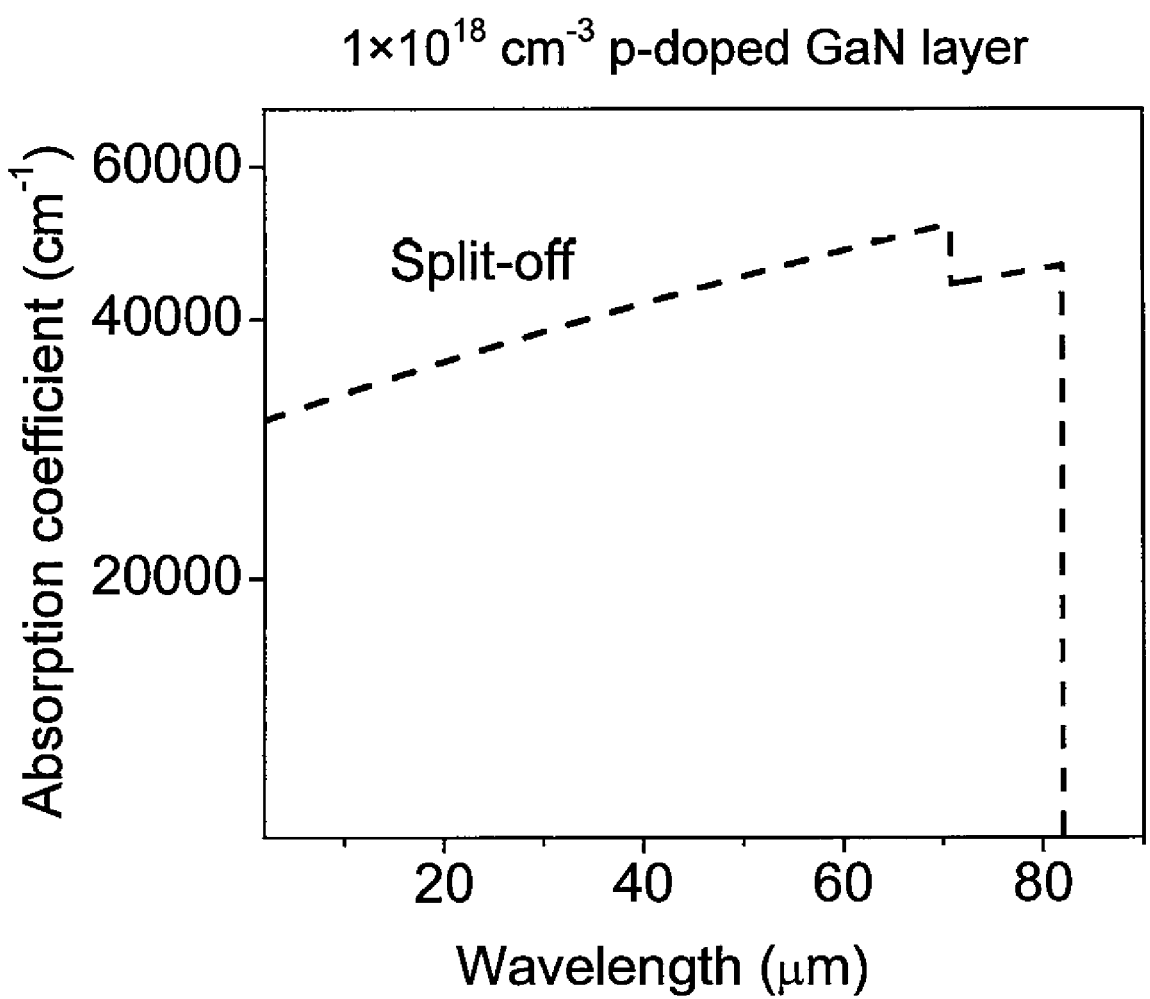

FIG. 6 is a plot that illustrates the measured responsivity and calculated absorption coefficient of a second exemplary SPIP detector. An alternative detector can include 16 periods with about $3.6 \times 10^{18}$ cm$^{-3}$ and about $1.2 \times 10^{18}$ cm$^{-3}$ Be-doped top contact and emitters, respectively. The conversion efficiency of the alternative detector at about 50 K and a bias field of about 3 kV/cm is shown in FIG. 6. The broad response from about 5-15 μm is due to the free carrier absorption and the sharp peak at about 2-4 μm is due to the S—O response. This increased conversion efficiency is due to the increased absorption/emission in the S—O region. For free carrier and indirect absorption response, i.e. detection mechanisms illustrated in FIGS. 4A, 4C, and 4D, a phonon or an impurity scattering event is required in the absorption to conserve momentum, while in the direct absorption response illustrated in FIG. 4B and indirect absorption response illustrated in FIG. 4D, a scattering event is also required. Since the detection mechanism illustrated in FIG. 4D requires two extra particles, it should be slower than the other three. The threshold for the indirect absorption response illustrated in FIG. 4C will be shorter than for the detection mechanisms illustrated in FIGS. 4B and 4D due to the requirement of passing the barrier in the S—O band. Based on the width and two thresholds in the S—O response, both direct and indirect absorptions are occurring in the S—O response.

In order to understand the strong response observed using the S—O band, calculations were carried out to determine the relative absorptions for the free carrier and S—O responses. The first step was to use a k-p model, similar to that used in quantum dot and quantum well analysis, to calculate the L-H, H-H and S—O hole energy bands. The absorption coefficient was then calculated as a function of photon energy (hω) from the energy states in the bands. The calculation was done for about a 1 μm thick GaAs layer that was p-doped to about $1 \times 10^{18}$ cm$^{-3}$. The absorption by the S—O band was over an order of magnitude larger than for the free carrier absorption in the L-H/H-H bands, as shown in the inset of FIG. 6, indicating the relative improvement of the S—O mechanism in this range. Similarly, the measured absorption is increased in the split-off region compared to the expected free carrier absorption as shown in the insert of FIG. 5. The experimental conversion efficiency is larger than the calculated conversion efficiency (even with the increased experimental absorption taken into account). This difference may be caused by the gain resulting from the large split-off energy (about 340 meV) for GaAs. The high energy for carriers that have been excited into the split-off band means they will have sufficient energy to excite additional carriers via impact effects, introducing a high gain factor into the detectors. The step seen in the response at about 3.4 μm is in good agreement with the calculated results shown in the inset to FIG. 6. However, there is a small discrepancy with the drop calculated to occur at about 2.9 μm. The experimental step is about 0.15 μm wide (possibly due to the effects of the photoemission process) and the threshold may be longer than it appears in FIG. 5.

The tested devices with a threshold in the range of about 20 μm had a maximum operating temperature of about 130 K. By reducing the threshold to about 5 μm, the operating temperature can increased to about 300 K with D* of ~5×10$^9$ Jones. The response can be adjusted by increasing number of layers in order to get increased absorption and using surface plasmon resonances in metallic nanoparticles deposited on the detector. A device designed to work at and above room temperature may compete with currently available uncooled detectors. Materials other than GaAs/AlGaAs may lead to improved coverage of the about 3-5 μm range. A direct transition to the S—O band for phosphate materials gives a threshold in the range of about 11 to 18 μm, while the nitride materials may be able to operate in ranges of about 60 to 410 μm in the S—O mode. The S—O band offset energy and potential threshold wavelengths are indicated in TABLE 1. In addition, FIGS. 7A through 7E are plots illustrating the calculated absorption coefficient for the S—O band absorptions in 1×10$^{18}$ cm$^{-3}$ p-doped GaAs, InP, AlP, AlN, and GaN emitter layers, respectively.

Figure 8:
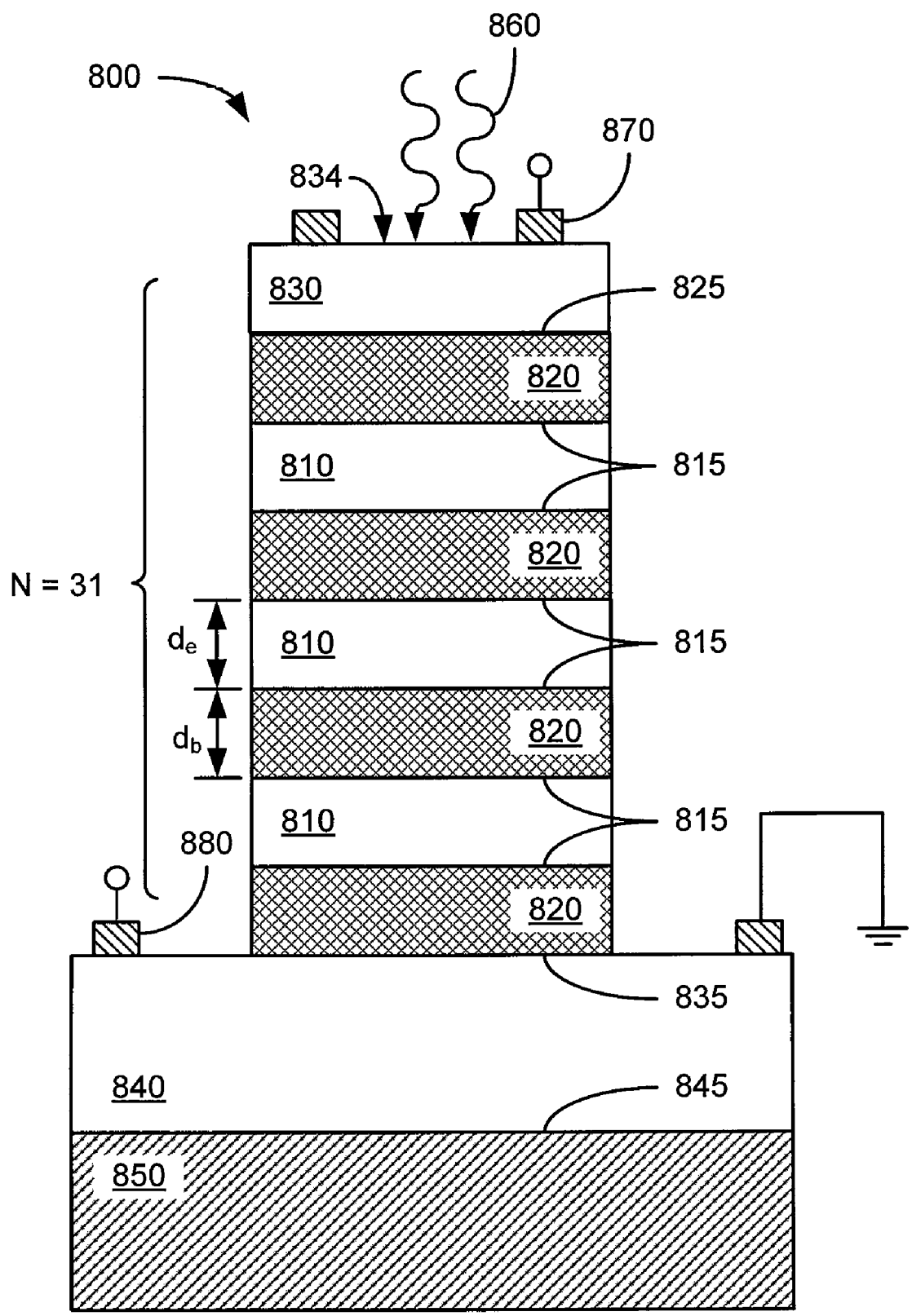
FIG. 8 illustrates an alternative embodiment of a Split-off infrared photodetector.

FIG. 8 illustrates an alternative embodiment of a SPIP detector 800. The detector 800 can have several emitter layers 810 and barrier layers 820 sandwiched between first and second contact layers, 830 and 840 respectively. The detector 800 is configured to detect light having a wavelength in the infrared range and also functions under uncooled operation. In other words, the detector 800 may provide response and detect such light under operating temperatures of up to and exceeding room temperature (e.g. about 300 K). The depicted detector 800 includes emitter 810 layers comprising GaAs having a thickness of about 188 Å. The emitter 810 layers are further p-doped with a dopant concentration of Be of about 3×10$^{18}$cm$^{-3}$. The detector 800 includes barrier layers comprising undoped Al$_{0.57}$Ga$_{0.43}$As having a thickness of about 600 Å. It should be appreciated that the fractional relationship of the elements comprising the emitter and barrier layers may be adjusted while achieving the same or similar results; however, the above disclosed fractional relationships of the elements comprising detector 800 layers is configured to detect at least light having a wavelength in the infrared range under uncooled operation. It should be appreciated that the depiction of FIG. 8 is merely for illustrative purposes and does not disclose all barrier layers 820 or emitter layers 810. The total number of barrier layers 820 is N, where N is equal to 31. Therefore, in the exemplary embodiment illustrated in FIG. 8, the total number of barrier layers 820 is thirty-one.

Each barrier 820 is a layer of a material made from Aluminum, Gallium, and Arsenic. The material comprising the barrier 820 of the depicted detector 800 includes about 28.5% Aluminum, 21.5% Gallium and 50% Arsenic. It should be appreciated that such a material can be expressed as Al$_{0.57}$Ga$_{0.43}$As. It should further be appreciated that the fractional relationships of the elements comprising the barrier 820 can be adjusted or varied to achieve the same or similar results of the depicted detector 800. For example, it should be appreciated that the group III element "In" may be substituted for Al of the barrier 820, or, alternatively, combinations of group III elements may be substituted for Al or Ga to achieve the same or similar results. Further, group V elements such as Sb or combinations thereof may be substituted for As to achieve the same or similar results.

The barrier 820 is further characterized by a bandgap. The construction parameters of each barrier 820 can include, but not limited to, the fractional relationship or relative concentration of the elements comprising the barrier 820, the thickness of the barrier layer 820, the bandgap of the barriers 820, and the total number N of the barriers 820. As mentioned above, the total number N of the barriers 820 in the depicted detector is thirty-one; however, it should be appreciated that the number N of barriers 820 may be varied in accordance with the disclosure.

The detector 800 further has emitter layers 810, where the total number of emitters is N−1. In the exemplary embodiment illustrated in FIG. 8, the total number of emitters 810 is N−1=30. It should be appreciated that the number of emitters 810 may be varied in accordance with the disclosure to achieve the same or similar results. It should further be appreciated that because contacts 830, 840 can be configured to be chemically similar to emitters 810, they may also act as an emitter in the depicted detector 800 design. In the depicted detector 800, each emitter 810 is a layer of material made from GaAs that is doped with Be to cause free carriers in the emitter 810. It should be appreciated that the emitters 810 may be doped by adding a doping element other than Be including, but not limited to, group II elements and/or group IV elements. It should further be appreciated, however, that the emitter 810 may also comprise a group III element (e.g., Al, Ga, In, and combinations thereof) and a group V element (e.g., N, P, As, Sb, and combinations thereof). Further, the dopant element and the concentration of the dopant element may be varied in accordance with the disclosure to achieve the same or similar results. For example, the use of different doping and different materials can extend the split-off response of the detector 800 to longer wavelengths.

As a further alternative design for the detector's 800 emitter and barrier layers, InGaAsP is an alternate material that may be utilized to reduce the split-off energy of the emitter layers. An emitter constructed using In$_{0.294}$Ga$_{0.706}$As$_{0.4}$P$_{0.6}$ with a dopant concentration of about 3×10$^{18}$ cm$^{-3}$ and a thickness of about 200 Å should result in a split-off threshold near 5.1 μm. Barrier layers constructed using Al$_{0.30}$Ga$_{0.70}$As$_{0.4}$ with a thickness of about 400 Å can also be used in this alternative design. It should be appreciated that such an alternative design in accordance with the disclosure would operate to adjust the light wavelength response of the detector 800. For example, in the above alternative design, the detector would detect light having a wavelength in the range of about 3 to about 5 μm.

The emitter 810 is further characterized by a bandgap different from that of the barriers 820, wherein each emitter 810 is located between two barriers 820 so as to form a heterojunction at each interface 815 between an emitter 810 and a barrier 820. The construction parameters of each emitter 810 can include the chemical identities of the group III element, the group V element, and the doping element from the group II or IV elements, the thickness of the emitter layer 810, the doping concentration of the doping element, the bandgap of the emitters 810, and the total number N−1 of the emitters 810.

The detector 800 has a first contact layer 830 in contact with one outermost barrier 820 at interface 825. The detector 800 also has a second contact layer 840 in contact with the opposite outermost barrier 820 at interface 835. The first contact layer 830 and the second contact layer 840 are made from 1×10$^{19}$ cm$^{-3}$ p-doped GaAs layers. The first contact layer 830 can have a thickness of about 0.2 μm, while the second contact layer 840 may have a thickness of about 0.7 μm. Depending on the doping required for ohmic contacts discussed hereinbelow, the first contact 830 may also serve as a top emitter layer. The detector 800 further has a substrate 850 in contact with the second contact layer 840 at interface 845. The substrate 850 is made from a material compatible with the material from which the emitters 810 and barriers 820 are made but may be either undoped or doped. In the depicted embodiment, the substrate 850 is made from undoped GaAs.

The first contact layer 830 has a surface 834 to receive optical signals 860. Moreover, ohmic contacts 870 and 880 located at the first and second contact layers 830 and 840, respectively, can be utilized for measuring the response of the detector 800 to the incoming optical signals 860. Ohmic contacts 870 and 880 can be made of a conductive material including but not limited to Ti, Pt, and Au. It should be appreciated that a number of conductive elements and/or compounds may be utilized for contacts 870 and 880 in order to provide the ability to measure the response of the detector 800.

Figure 9:
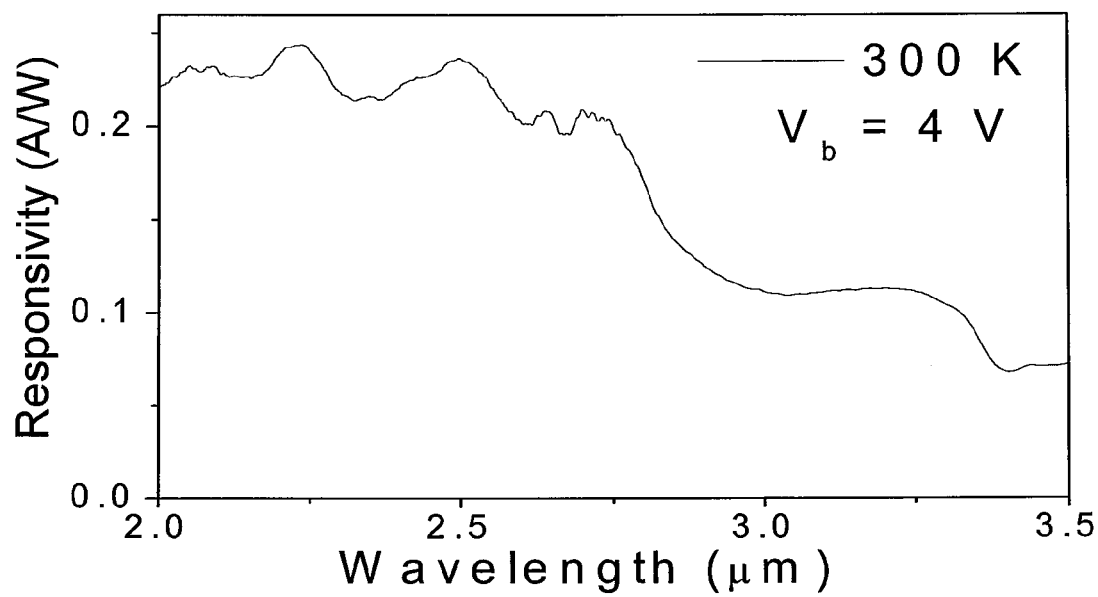
FIG. 9 is a plot illustrating the responsivity of a SPIP detector operating at a temperature of 300 K.

FIG. 9 depicts the response of the response of the exemplary detector 800 at 300 K. It should be appreciated that this temperature represents a room temperature environment, but that the detector 800 can provide a response in operating environments up to and exceeding room temperature. As noted above, the operation of detector 800 is dependent upon three processes: (i) the photoabsorption in layers 810 and either 830 or 840 depending on the direction of the applied bias from optical signals 860 that generate excited carriers, (ii) the escape of the carriers, and (iii) the sweep out and collection of the escaped carriers. At an operating temperature of 300 K, the process illustrated in FIG. 4B becomes dominant as can be seen by the larger step at 2.9 μm (which is due to the process illustrated in FIG. 4B) than at 3.4 μm (which is due to the process illustrated in FIG. 4D). Based on these results and the dark current, which can be measured in the detector 800 in the absence of light or optical signals on the surface 834, it should be appreciated that the specific detectivity (D*) of the detector 800 can be estimated to be $10^9$ Jones.

Figure 10:
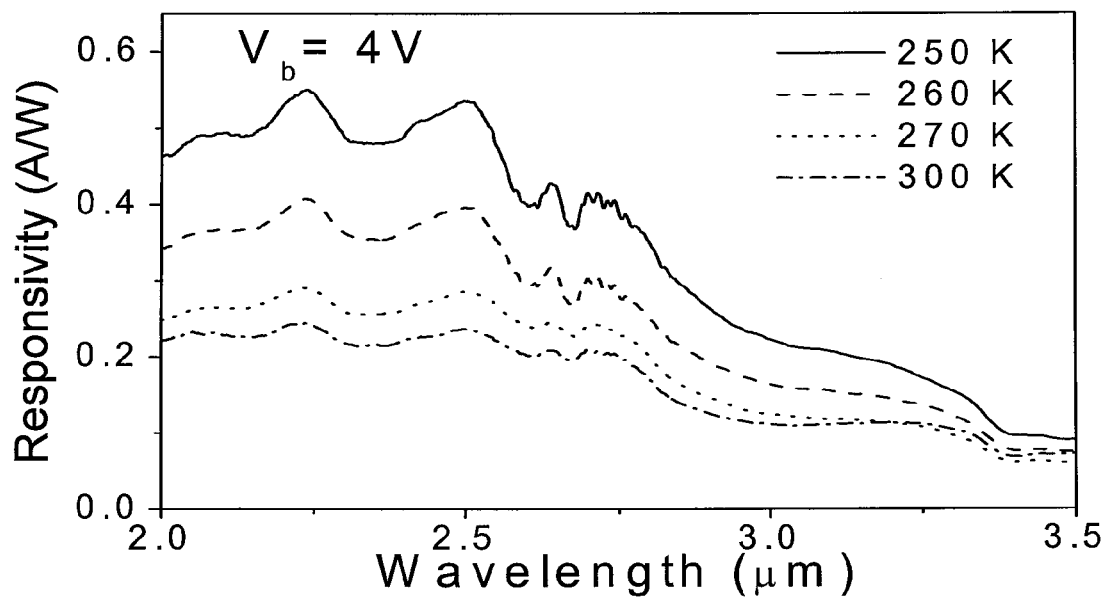
FIG. 10 is a plot illustrating the responsivity of a SPIP detector at various operating temperatures.
Figure 11:
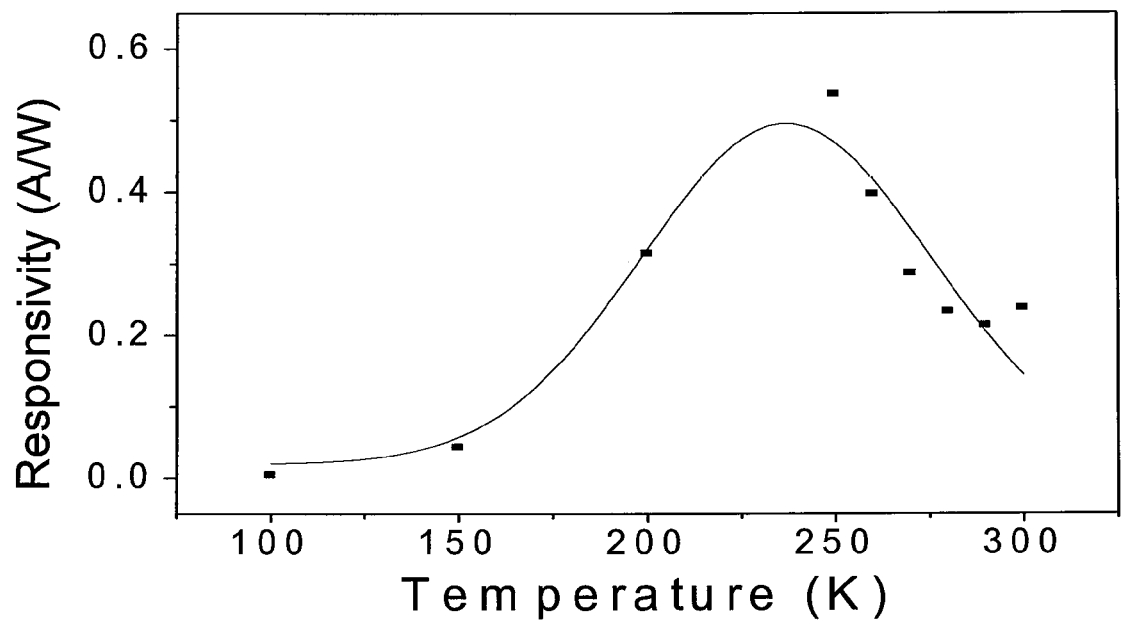
FIG. 11 is a plot illustrating the responsivity of a SPIP detector at various operating temperatures.

FIG. 10 depicts the split-off response of the detector 800 at varying operating temperatures depending on the wavelength of optical signals received by the detector 800. Split-off response increases as the temperature is increased from about 100 K to 240 K with a peak response about 250K. However, FIG. 10 depicts a response at about 0.24 A/W for optical signals having a wavelength of about 2.0 μm at an operating temperature of about 300 K. The threshold for the free carrier response increased slightly with temperature due to the increased number of carriers above the Fermi energy, which can result in response at longer wavelengths. The increased responsivity and decreased dark current at about 240 K gives a specific detectivity (D*) of about $3\times10^9$ Jones. FIG. 11 illustrates the measured responsivity of the detector 800 at about 2.5 μm for temperatures ranging from about 100K to 300 K. Peak responsivity of the detector 800 exists at an operating temperature of about 240 K; however, it should be appreciated that the detector 800 provides a response at and above room temperature as well.

Figure 12:
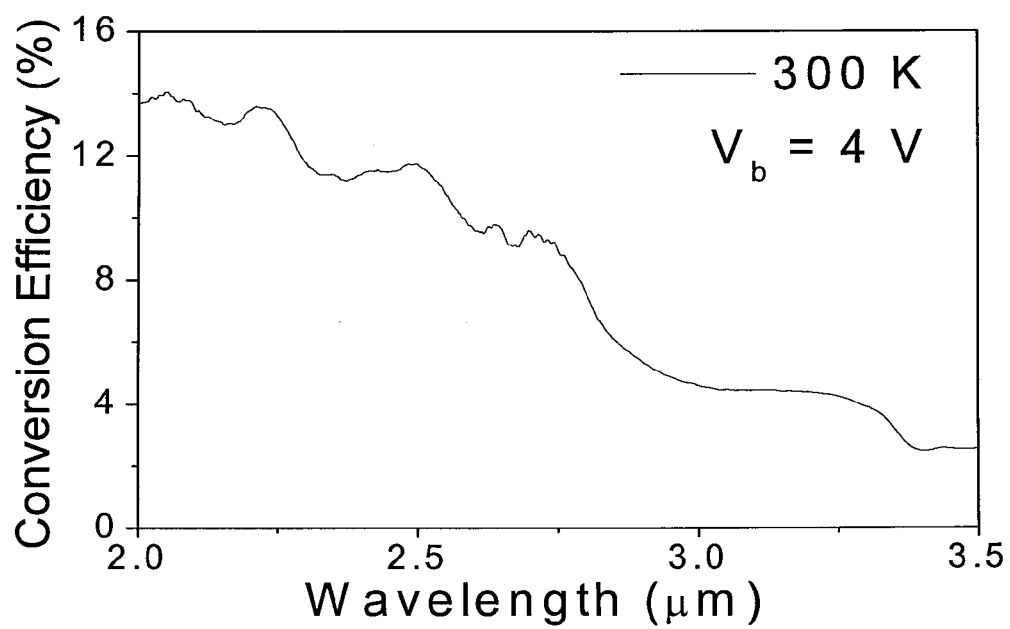
FIG. 12 is a plot illustrating the conversion efficiency of a SPIP detector operating at a temperature of 300 K.
Figure 13:
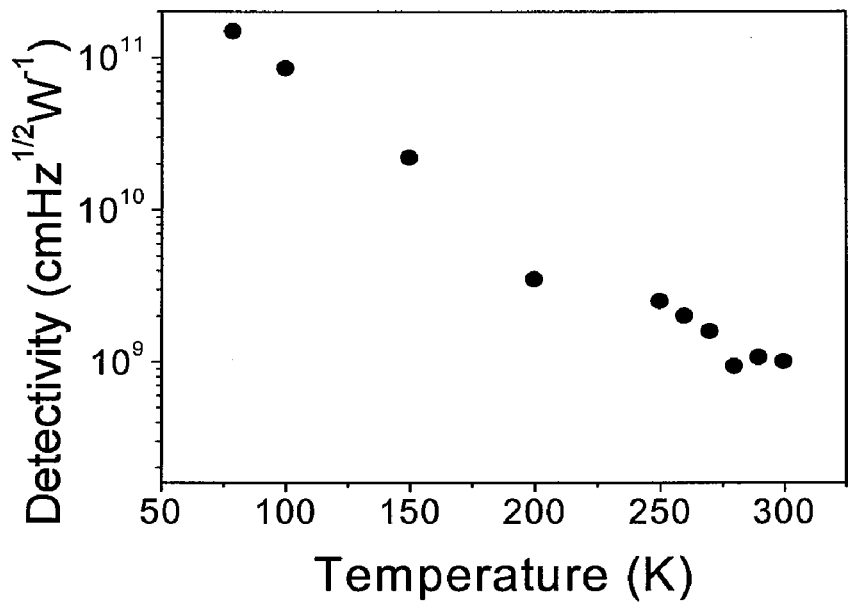
FIG. 13 is a plot illustrating the detectivity of a SPIP detector at various operating temperatures.

The conversion efficiency of the detector 800 for optical signals received by the detector having a wavelength in the range of about 2 μm to 3.5 μm at about 300 K and a voltage bias of about 4V ($V_b$) applied to the detector 800 is illustrated in FIG. 12. The steps in the graph at about 3.4 μm and 2.9 μm correspond to the thresholds for the processes illustrated in FIGS. 4B and 4D respectively. This increased conversion efficiency is due to the increased absorption/emission in the split-off region. FIG. 13 shows temperature variation of the detectivity. The detectivity of the detector 800 can be calculated using measured responsivity and noise current. The specific detectivity (D*) of the detector 800 is about $1\times10^9$ Jones at 300 K and increases at lower operating temperatures; however, the detector 800 is operable at and above room temperature as illustrated.

Figure 14:
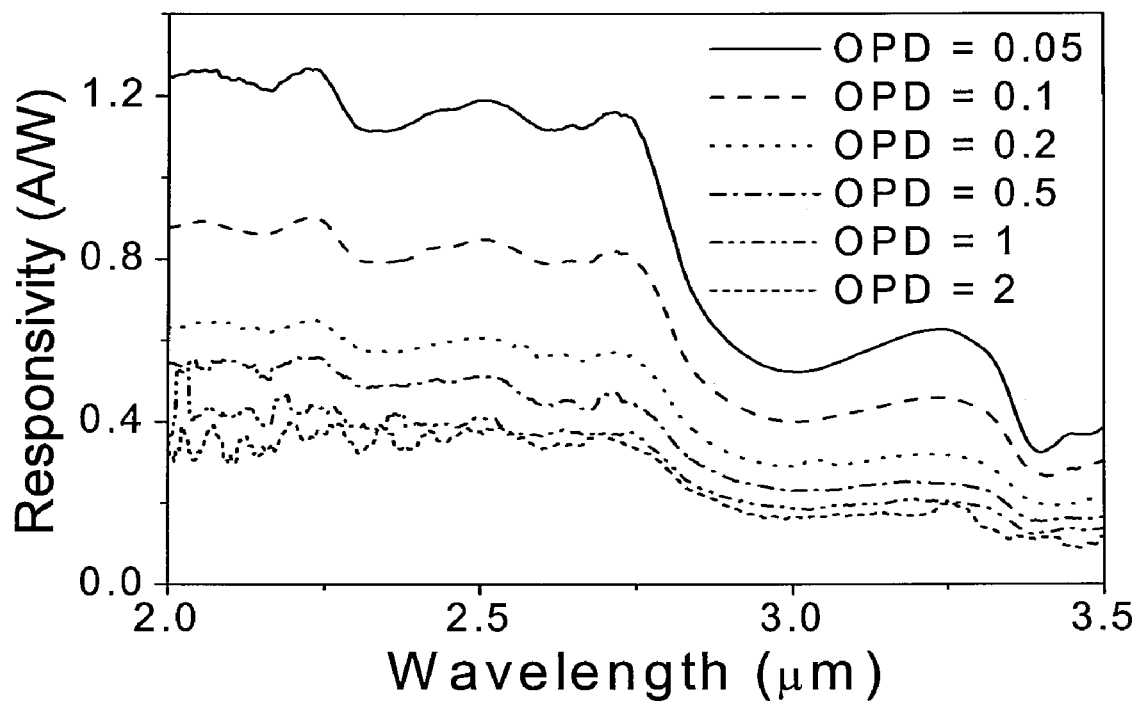
FIG. 14 is a plot illustrating the responsivity of a detector for a temperature of 313 K at various OPD.
Figure 15:
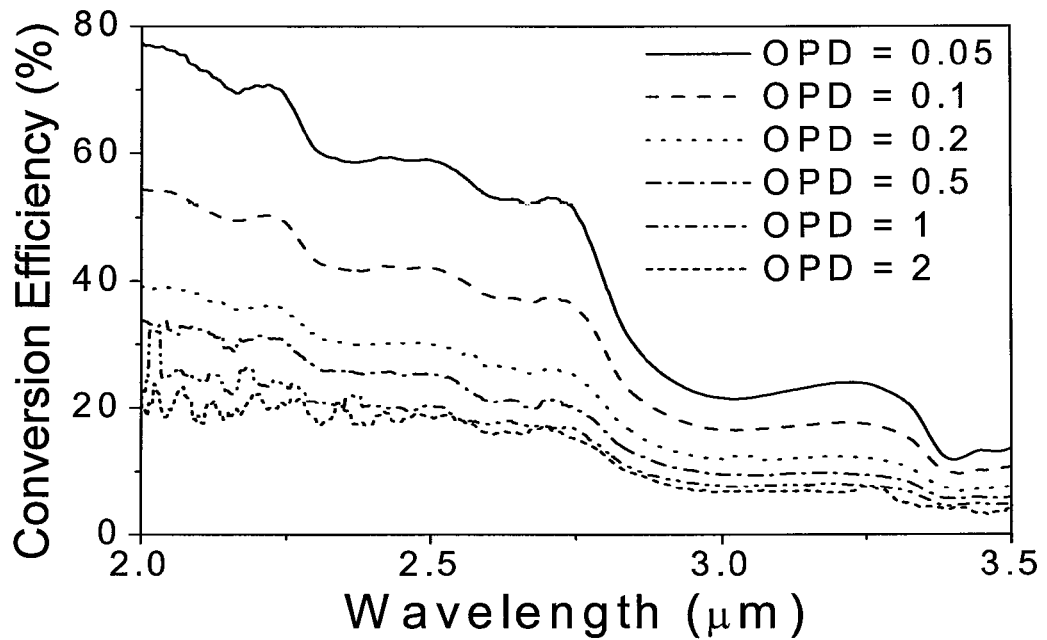
FIG. 15 is a plot illustrating the conversion efficiency of a detector for a temperature of 313 K at various OPD velocities.

FIG. 14 shows the response variation with measuring speed at a temperature of 313 K which is above room temperature. The lower Optical Path Difference (OPD) velocities corresponding to slower measurement speeds exhibit higher responsivity values due to phonon assisted response mechanisms that are relatively slow. Even though the response shows significant variation with the OPD velocity the response mechanism is photon detection and not of a bolometric type. FIG. 15 illustrates conversion efficiency of the detector 800 with different OPD velocities. Lower OPD results in higher conversion efficiency because more photo-generated carriers are escaping within the measurement time period. A conversion efficiency of ~80% is observed at 313 K with an OPD velocity of 0.05 cm/s.

Figure 16:
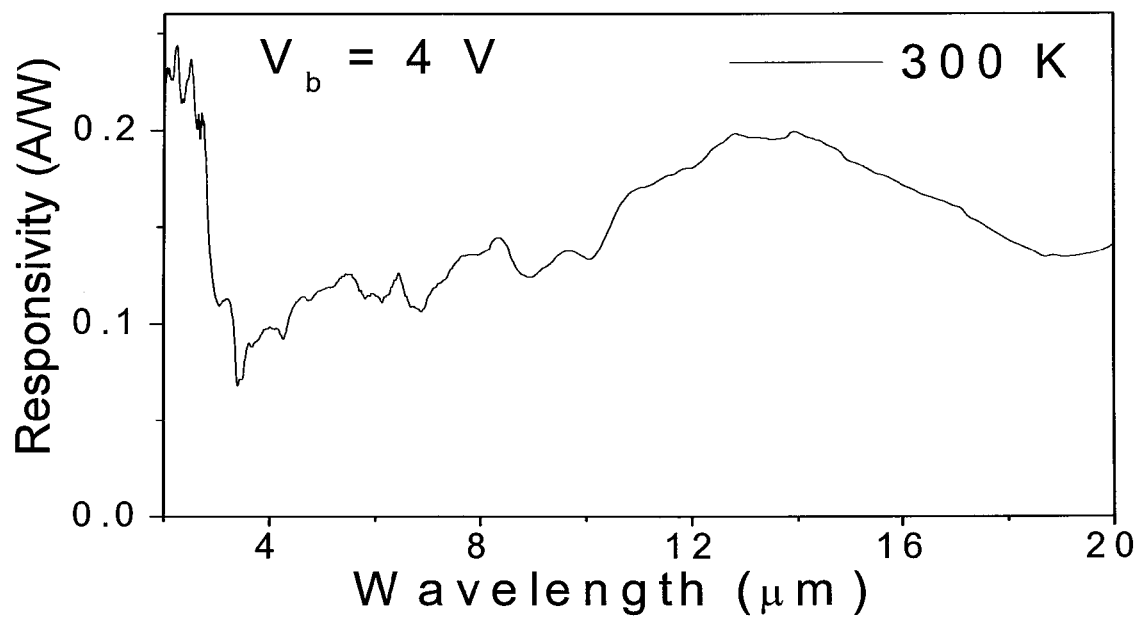
FIG. 16 is a plot illustrating the responsivity of a SPIP detector to light having a wavelength outside the direct splitoff threshold range operating at a temperature of 300 K.
Figure 17:
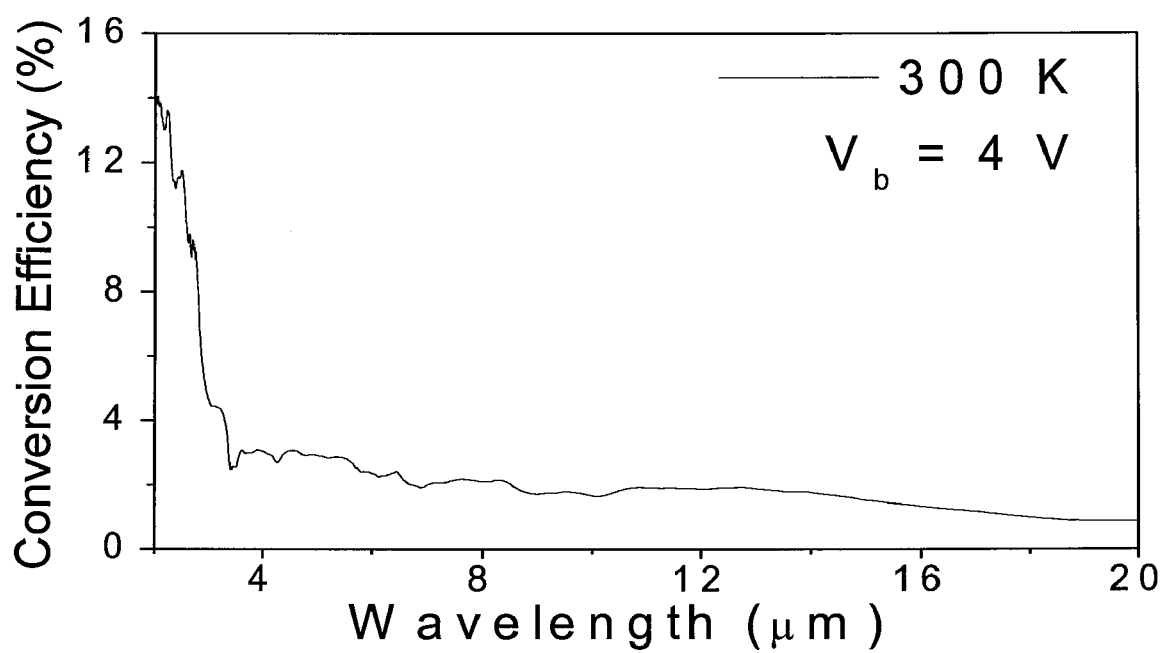
FIG. 17 is a plot illustrating the conversion efficiency of a SPIP detector to light having a wavelength outside the direct splitoff threshold range operating at a temperature of 300 K.

The disclosed detector also exhibits response to optical signals having a wavelength outside of the direct split-off infrared range at higher operating temperatures (e.g., above 240 K). FIG. 16 illustrates the responsivity of the detector at wavelengths outside of the direct split-off infrared range at an operating temperature of 300 K. Similarly, FIG. 17 illustrates conversion efficiency at wavelengths outside the direct split-off infrared range.

It should be emphasized that the above-described embodiments of the present disclosure are merely possible examples of implementations, and are merely set forth for a clear understanding of the principles of the disclosure. For instance, the disclosed detectors and variations thereof can provide a response in operating environments at and exceeding room temperature. Therefore, many variations and modifications may be made to the above-described embodiment(s) of the disclosure without departing substantially from the spirit and principles disclosed herein. All such modifications and variations are intended to be included herein within the scope of this disclosure. In particular the different material combinations shown in Table 1 can be used to generate a response in a detector for wavelengths ranging from 3 to 60 microns.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In addition, the phrase "about 'x' to 'y'" includes "about 'x' to about 'y'".

Many variations and modifications may be made to the above-described embodiments. All such modifications and variations are intended to be included herein within the scope of this disclosure and protected by the following claims.

TABLE 1

| Material | $\Delta_{SO}$ (meV) | $\Delta_{SO}$ (μm) |
| --- | --- | --- |
| InN | 3 | 410 |
| GaN | 20 | 62 |
| AlN | 19 | 65 |
| InP | 108 | 11 |
| GaP | 80 | 16 |
| AlP | 70 | 18 |
| InAs | 390 | 3.2 |
| GaAs | 340 | 3.6 |
| AlAs | 280 | 4.4 |

Therefore, the following is claimed:

1. A photodetector comprising:
a first barrier and a second barrier, each barrier being a layer of a first semiconductor material; and
an emitter disposed between the first and second barriers so as to form a heterojunction at each interface between the emitter and the first and second barriers, the emitter being a layer of a second semiconductor material different from the first semiconductor material and having a split-off response to optical signals and further having a cutoff wavelength.

2. The photodetector of claim 1, wherein the split-off response occurs over a range of wavelengths, the range having an upper limit.

3. The photodetector of claim 2, wherein the cutoff wavelength is within one times the upper limit.

4. The photodetector of claim 2, wherein the cutoff wavelength is within two times the upper limit.

5. The photodetector of claim 2, wherein the cutoff wavelength is within four times the upper limit.

6. The photodetector of claim 1, wherein the first semiconductor material comprises a first group III element, a second group III element, and a first group V element.

7. The photodetector of claim 6, wherein the first group III element is selected from: Al, Ga, In, and combinations thereof,
the second group III element is selected from: Al, Ga, In, and combinations thereof, and
the first group V element is selected from: N, P, As, Sb, and combinations thereof.

8. The photodetector of claim 6, wherein the first group III element is Al, the second group III element is Ga, and the first group V element is As.

9. The photodetector of claim 1, wherein the first semiconductor material comprises $Al_{0.57}Ga_{0.43}As$.

10. The photodetector of claim 1, wherein the second semiconductor material comprises a third group III and a second group V element.

11. The photodetector of claim 10, wherein the third group III element is selected: Al, Ga, In, and combinations thereof, and
the second group V element is selected from: N, P, As, Sb, and combinations thereof.

12. The photodetector of claim 10, wherein the emitter is doped with at least one doping element selected from: group II elements, group IV elements, and combinations thereof.

13. The photodetector of claim 12, wherein the group II element is selected from: Be, Mg, and combinations thereof, and the group IV element is C.

14. The photodetector of claim 1, wherein the emitter comprises GaAs.

15. The photodetector of claim 14, wherein the split-off response occurs over a range of wavelengths, the range having an upper limit of about 3.6 μm.

16. The photodetector of claim 15, wherein the cutoff wavelength is in the range of about 4 μm to 8 μm.

17. The photodetector of claim 1, wherein an operating temperature exceeds room temperature.

18. A photodetector comprising:
a plurality of barriers, each of the plurality of barriers being a layer of a first semiconductor material; and
a plurality of emitters, each of the plurality of emitters being a layer of a second semiconductor material different from the first semiconductor material and having a split-off response to optical signals and further having a cutoff wavelength; wherein
each of the plurality of barriers is disposed adjacent to at least one of the plurality of emitters so as to form a heterojunction at each interface between each of the plurality of barriers and at least one of the plurality of emitters.

19. The photodetector of claim 18, wherein the plurality of barriers comprise at least thirty-one layers, and the plurality of emitters comprise at least thirty emitters.

20. The photodetector of claim 18, wherein the first semiconductor material comprises a first group III element, a second group III element, and a first group V element.

21. The photodetector of claim 20, wherein the first semiconductor material comprises an amount of group III elements, and wherein the ratio, X, of the first group III element is in the range of about 0.05 to 0.70 and the ratio of the second group III element is 1−X.

22. The photodetector of claim 18, wherein the second semiconductor material comprises a first group III element and a second group III element.

23. The photodetector of claim 22, wherein the second semiconductor material comprises a p-dopant.

24. The photodetector of claim 23, the p-dopant has a concentration of about $3 \times 10^{18}$ cm$^{-3}$.

25. A method of making of a photodetector, comprising the steps of:
providing an emitter base layer, the emitter base layer being a layer of a first semiconductor material,
disposing a first barrier on the base layer, the first barrier being a layer of a second semiconductor material,
disposing an emitter on the first barrier to form a heterojunction at a first interface between the emitter and the first barrier, the emitter being a layer of the first semiconductor material, wherein the first semiconductor material is a semiconductor differing from the second semiconductor material and having a split-off response to optical signals and further having a cutoff wavelength, and
disposing a second barrier on the emitter to form a heterojunction at a second interface between the emitter and the second barrier, the second barrier being a layer of the second semiconductor material.

* * * * *